US012000038B2

(12) United States Patent
Pain et al.

(10) Patent No.: US 12,000,038 B2
(45) Date of Patent: Jun. 4, 2024

(54) METHOD FOR MANUFACTURING AN ELECTROCHEMICAL DEPOSITION PRINTHEAD WITH GRID CONTROL CIRCUIT AND BACKPLANE

(71) Applicant: FABRIC8LABS, INC., San Diego, CA (US)

(72) Inventors: David Pain, Carlsbad, CA (US); Andrew Edmonds, Oceanside, CA (US); Jeffrey Herman, Solana Beach, CA (US); Charles Pateros, Carlsbad, CA (US); Kareemullah Shaik, San Diego, CA (US); Edward White, San Diego, CA (US)

(73) Assignee: FABRIC8LABS, INC., San Diego, CA (US)

( * ) Notice: Subject to any disclaimer, the term of this patent is extended or adjusted under 35 U.S.C. 154(b) by 72 days.

(21) Appl. No.: 17/863,272

(22) Filed: Jul. 12, 2022

(65) Prior Publication Data

US 2022/0349046 A1 Nov. 3, 2022

Related U.S. Application Data

(63) Continuation of application No. 17/099,602, filed on Nov. 16, 2020, now Pat. No. 11,401,603, which is a
(Continued)

(51) Int. Cl.
*C23C 16/04* (2006.01)
*B33Y 30/00* (2015.01)
(Continued)

(52) U.S. Cl.
CPC .......... *C23C 16/042* (2013.01); *B33Y 30/00* (2014.12); *C23C 14/042* (2013.01); *C23C 14/08* (2013.01);
(Continued)

(58) Field of Classification Search
CPC ................. B33Y 30/00; C25B 1/003
See application file for complete search history.

(56) References Cited

U.S. PATENT DOCUMENTS

| 4,575,330 A | 3/1986 | Hull |
| 4,678,282 A | 7/1987 | Yaniv et al. |

(Continued)

FOREIGN PATENT DOCUMENTS

| CN | 104178782 | 12/2014 |
| CN | 204097583 | 1/2015 |

(Continued)

OTHER PUBLICATIONS

Frey et al., "Switch-matrix-based High-Density Microelectrode Array in CMOS Technology", IEEE Journal of Solid-State-Circuits, Feb. 2010, pp. 467-482, vol. 45, No. 2.
(Continued)

*Primary Examiner* — Ciel P Contreras
(74) *Attorney, Agent, or Firm* — Kunzler Bean & Adamson

(57) ABSTRACT

Process for manufacturing a printhead for a 3D manufacturing system that uses metal electrodeposition to construct parts. The printhead may be constructed by depositing layers on top of a backplane that contains control and power circuits. Deposited layers may include insulating layers and an anode layer that contain deposition anodes that are in contact with the electrolyte to drive electrodeposition. Insulating layers may for example be constructed of silicon nitride or silicon dioxide; the anode layer may contain an insoluble conductive material such as platinum group metals and their associated oxides, highly doped semiconducting materials, and carbon based conductors. The anode layer may be deposited using chemical vapor deposition or physical vapor deposition. Alternatively in one or more embodiments the printhead may be constructed by manufacturing a
(Continued)

separate anode plane component, and then bonding the anode plane to the backplane.

20 Claims, 30 Drawing Sheets

Related U.S. Application Data continuation of application No. 16/926,598, filed on Jul. 10, 2020, now Pat. No. 10,914,000, which is a continuation-in-part of application No. 16/795,495, filed on Feb. 19, 2020, now Pat. No. 10,724,146.

(60) Provisional application No. 62/890,815, filed on Aug. 23, 2019.

(51) Int. Cl.

| | | |
|---|---|---|
| *C23C 14/04* | (2006.01) | |
| *C23C 14/08* | (2006.01) | |
| *C23C 14/14* | (2006.01) | |
| *C23C 16/27* | (2006.01) | |
| *C25D 5/10* | (2006.01) | |
| *C25D 17/00* | (2006.01) | |
| *B29C 64/112* | (2017.01) | |
| *B29C 64/209* | (2017.01) | |

(52) U.S. Cl.
CPC .......... *C23C 14/14* (2013.01); *C23C 16/278* (2013.01); *C25D 5/10* (2013.01); *C25D 17/00* (2013.01); *B29C 64/112* (2017.08); *B29C 64/209* (2017.08)

(56) References Cited

U.S. PATENT DOCUMENTS

| | | | |
|---|---|---|---|
| 5,132,820 | A | 6/1992 | Someya et al. |
| 5,403,460 | A | 4/1995 | Sala et al. |
| 5,641,391 | A | 6/1997 | Hunter et al. |
| 5,998,805 | A | 12/1999 | Shi et al. |
| 6,036,834 | A | 3/2000 | Clerc |
| 7,839,831 | B2 | 11/2010 | Vrcelj et al. |
| 8,168,540 | B1 | 5/2012 | Reid et al. |
| 8,681,077 | B2 | 3/2014 | Kimura |
| 9,777,385 | B2 | 10/2017 | Wirth et al. |
| 10,465,307 | B2 | 11/2019 | Pain et al. |
| 10,724,146 | B1 | 7/2020 | Pain et al. |
| 10,914,000 | B1 | 2/2021 | Pain et al. |
| 10,947,632 | B1 | 3/2021 | Pain et al. |
| 11,232,956 | B2 | 1/2022 | Pain et al. |
| 11,313,035 | B2 | 4/2022 | Pain et al. |
| 11,313,036 | B2 | 4/2022 | Pain et al. |
| 2001/0014409 | A1 | 8/2001 | Cohen |
| 2003/0006133 | A1 | 1/2003 | Metzger |
| 2004/0129573 | A1 | 7/2004 | Cohen |
| 2005/0045252 | A1 | 3/2005 | Yamasaki et al. |
| 2005/0176238 | A1 | 8/2005 | Cohen et al. |
| 2005/0183959 | A1 | 8/2005 | Wilson et al. |
| 2005/0202660 | A1 | 9/2005 | Cohen et al. |
| 2005/0223543 | A1 | 10/2005 | Cohen et al. |
| 2006/0144698 | A1 | 7/2006 | Hsu et al. |
| 2006/0283539 | A1 | 12/2006 | Slafer |
| 2007/0068819 | A1 | 3/2007 | Singh et al. |
| 2007/0089993 | A1 | 4/2007 | Schwartz et al. |
| 2007/0221504 | A1 | 9/2007 | Yuefeng |
| 2010/0300886 | A1 | 12/2010 | Lin et al. |
| 2011/0210005 | A1 | 9/2011 | Van Den Bossche et al. |
| 2015/0211136 | A1 | 7/2015 | Boon et al. |
| 2017/0145584 | A1 | 5/2017 | Wirth et al. |
| 2019/0160594 | A1 | 5/2019 | Flamm et al. |
| 2020/0215810 | A1 | 7/2020 | Sutcliffe et al. |
| 2021/0047744 | A1 | 2/2021 | Biton |

FOREIGN PATENT DOCUMENTS

| | | |
|---|---|---|
| CN | 104593830 | 5/2015 |
| WO | 2005033377 | 4/2005 |
| WO | 2017087884 | 5/2017 |
| WO | 2019150362 | 8/2019 |
| WO | 2021041265 | 3/2021 |

OTHER PUBLICATIONS

Stewart et al., "Polysilicon TFT Technology for Active Matrix OLED Displays", IEEE Transactions on Electron Devices, May 2001, pp. 845-851, vol. 48, No. 5.
International Search Report and Written Opinion for PCT/US2020/047531 dated Sep. 29, 2020.
Supplementary International Search Report for PCT/US2020/047531 dated Nov. 22, 2021.
U.S. Appl. No. 17/554,677, filed Dec. 17, 2021.
U.S. Appl. No. 17/566,546, filed Dec. 30, 2021.
U.S. Appl. No. 17/535,437, filed Nov. 24, 2021.

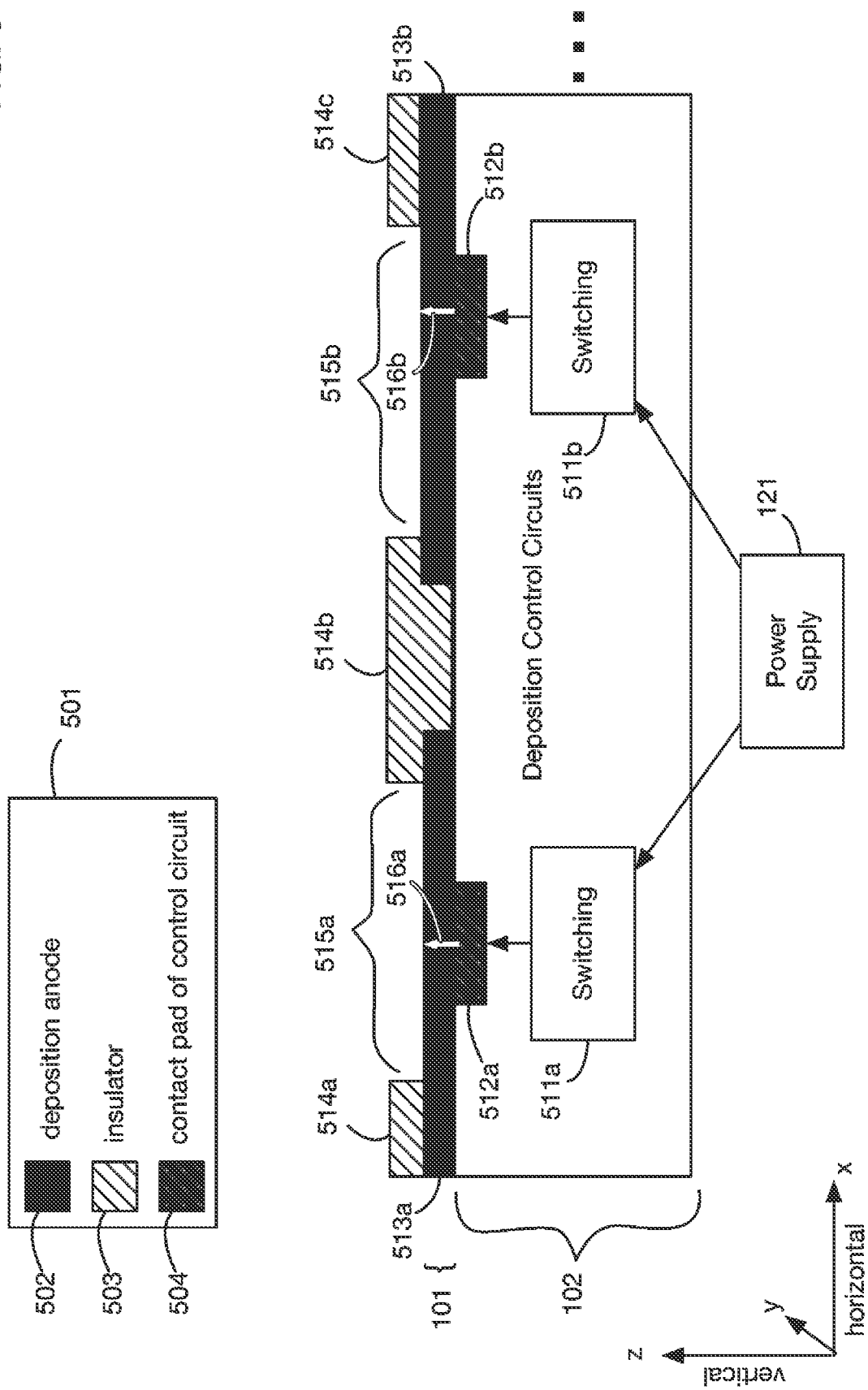

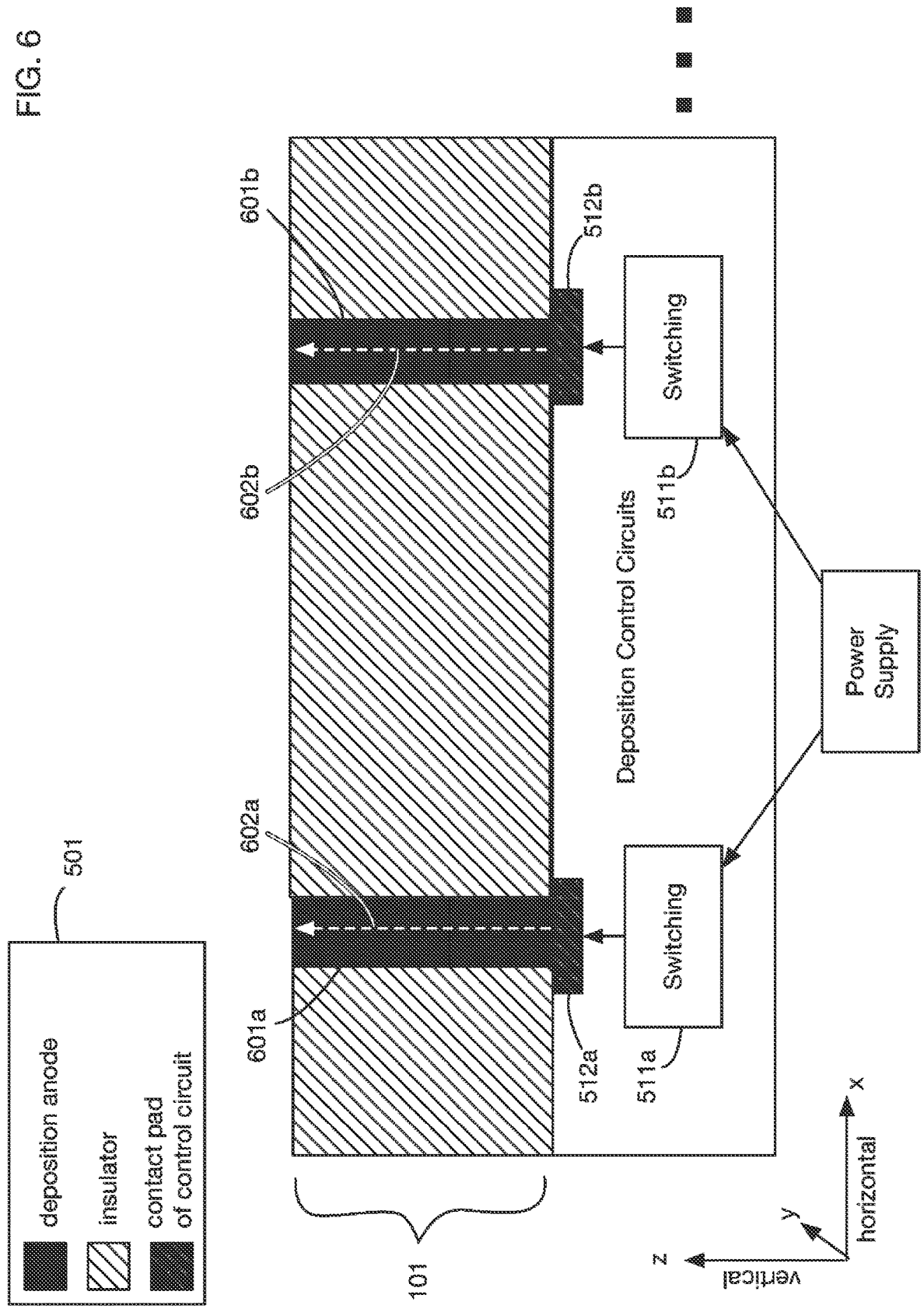

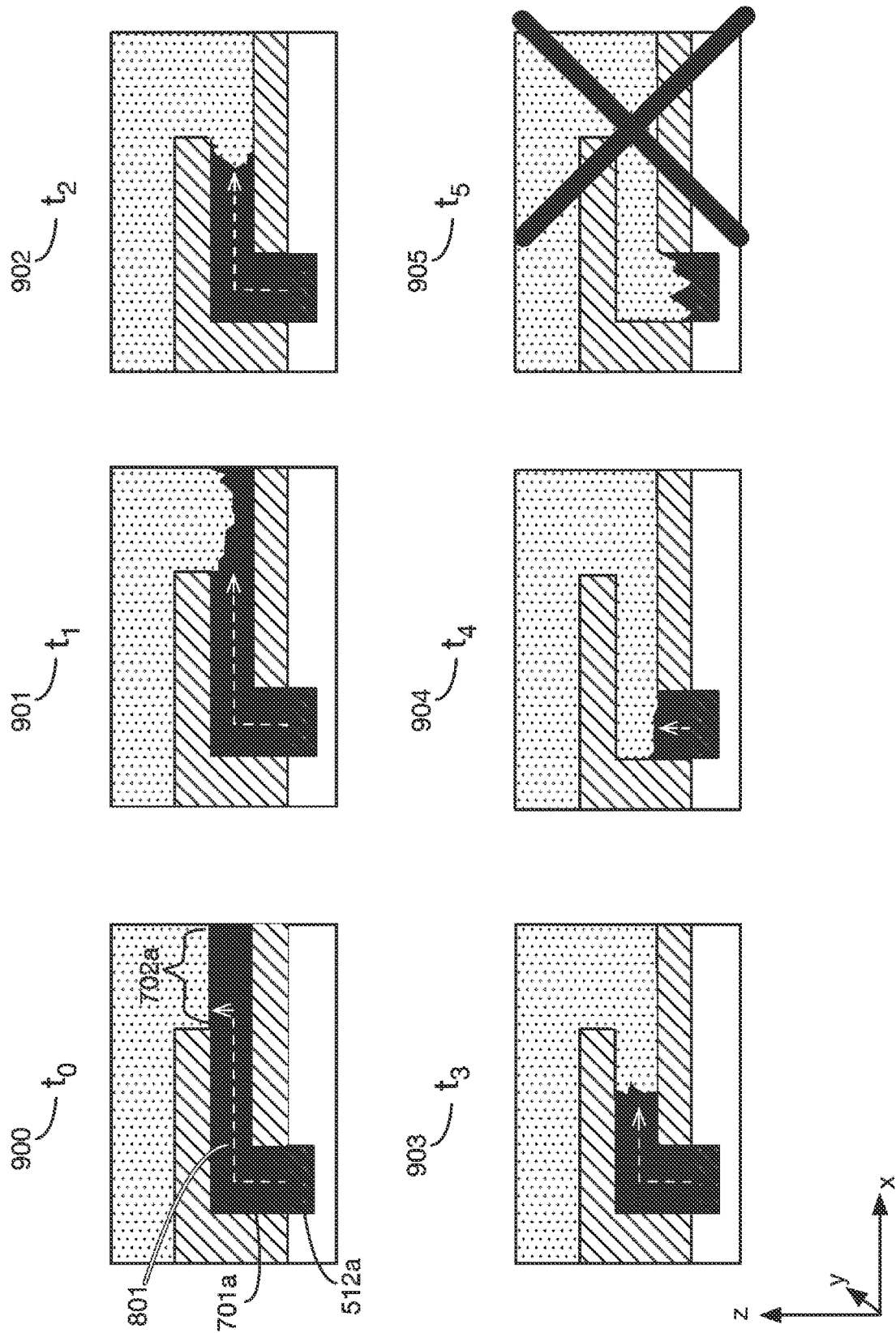

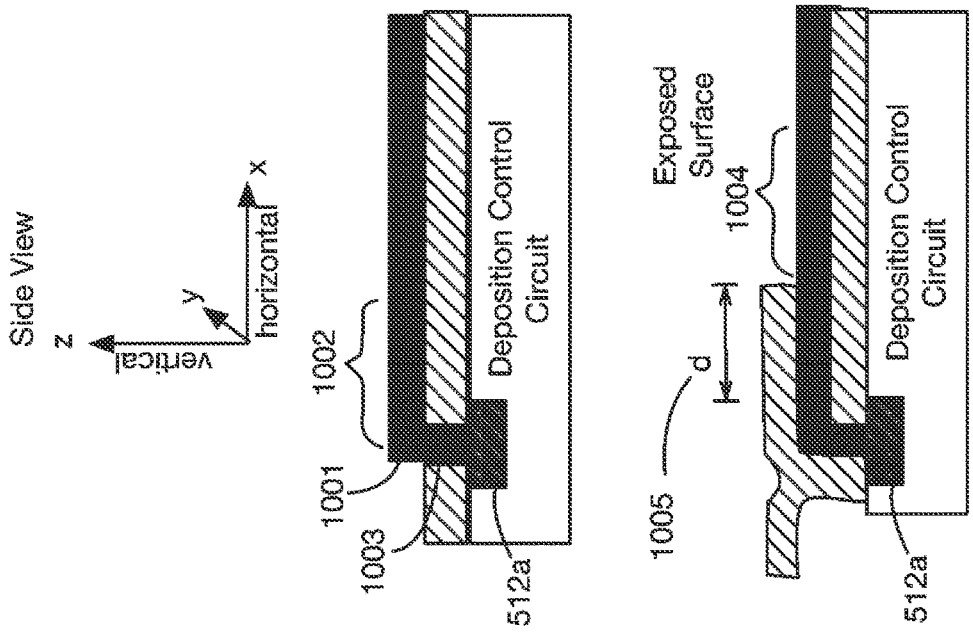
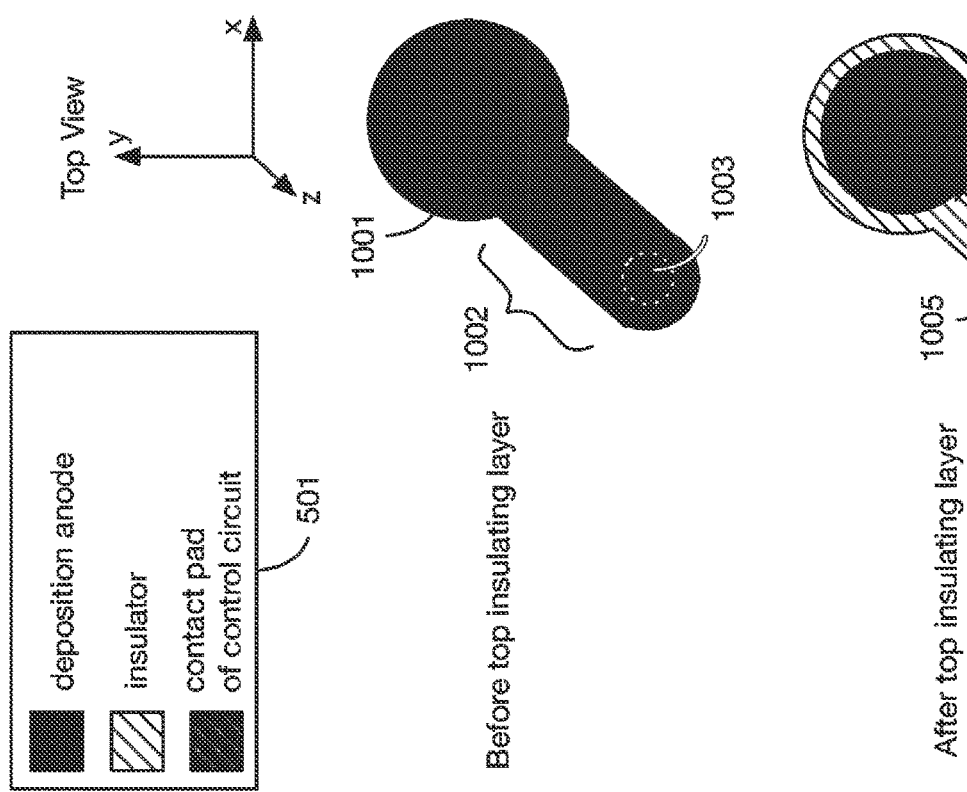

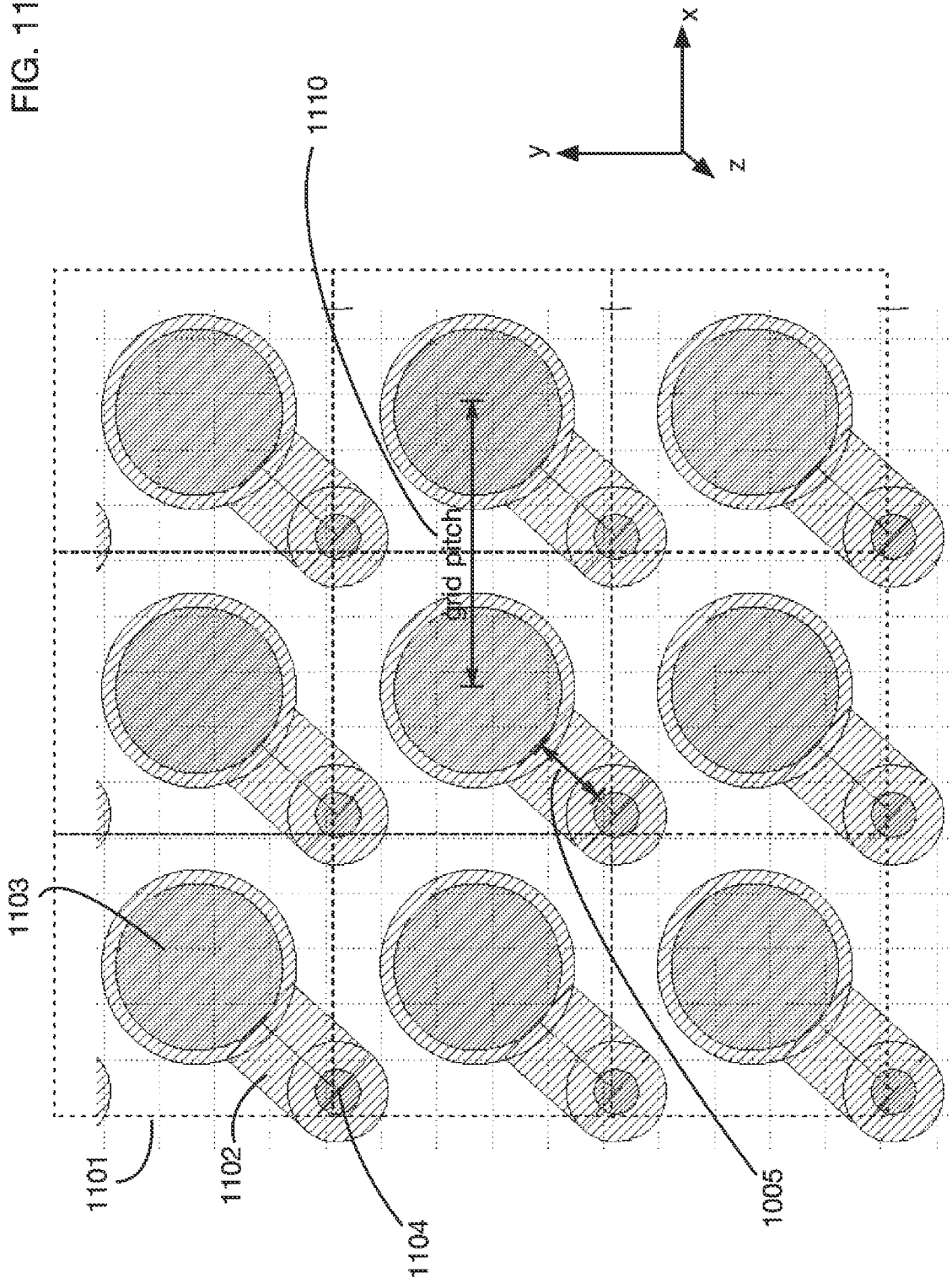

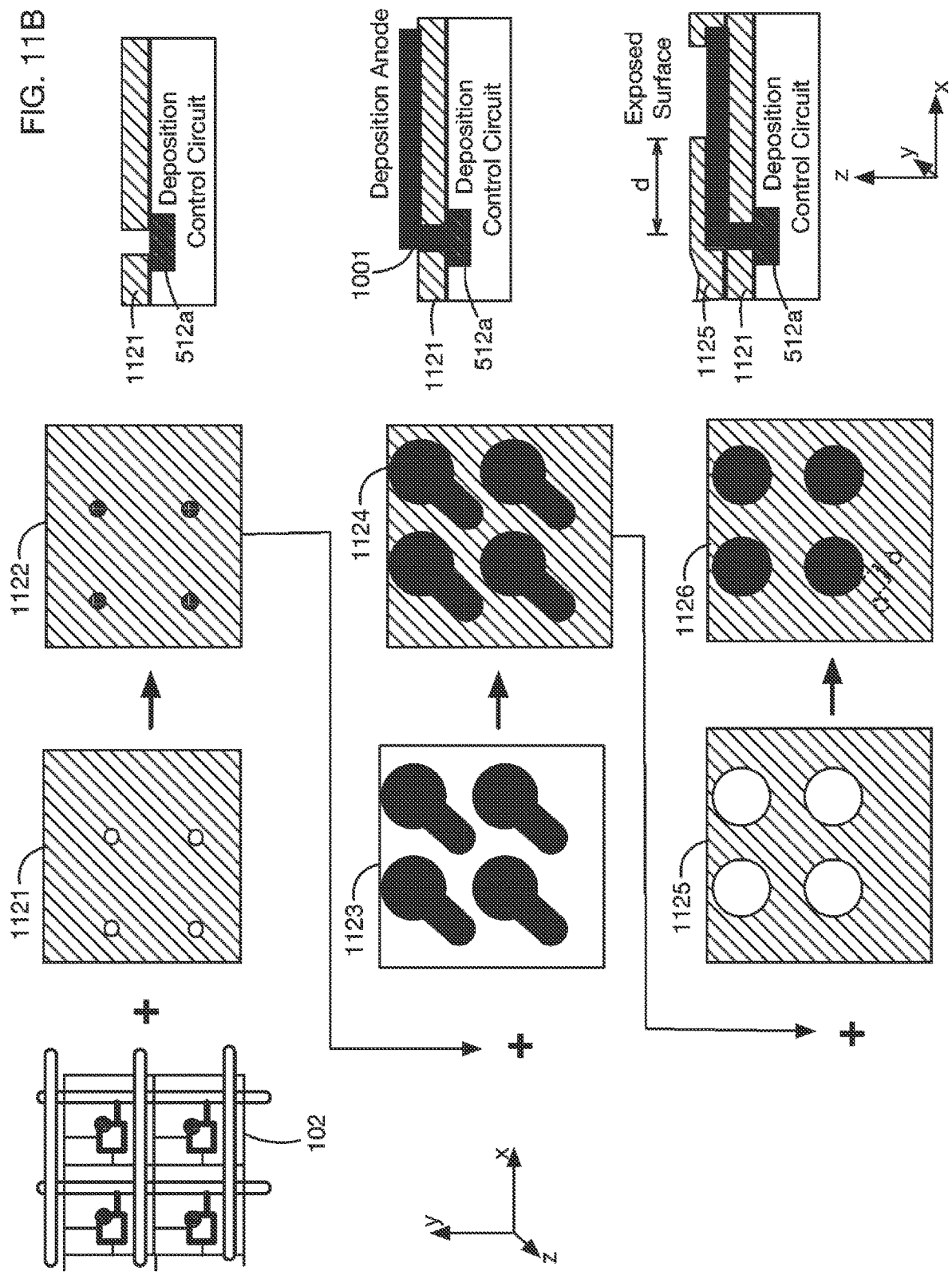

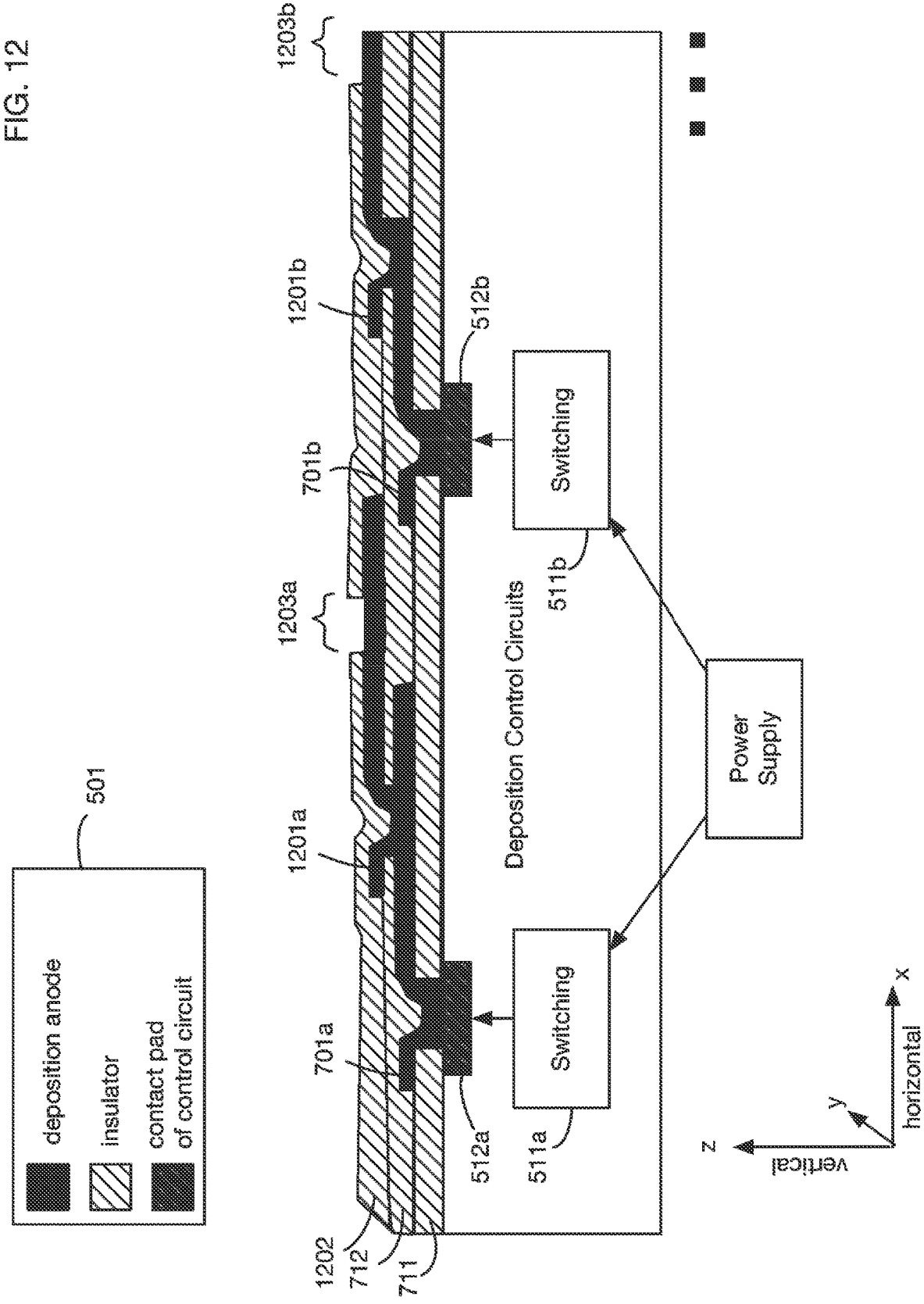

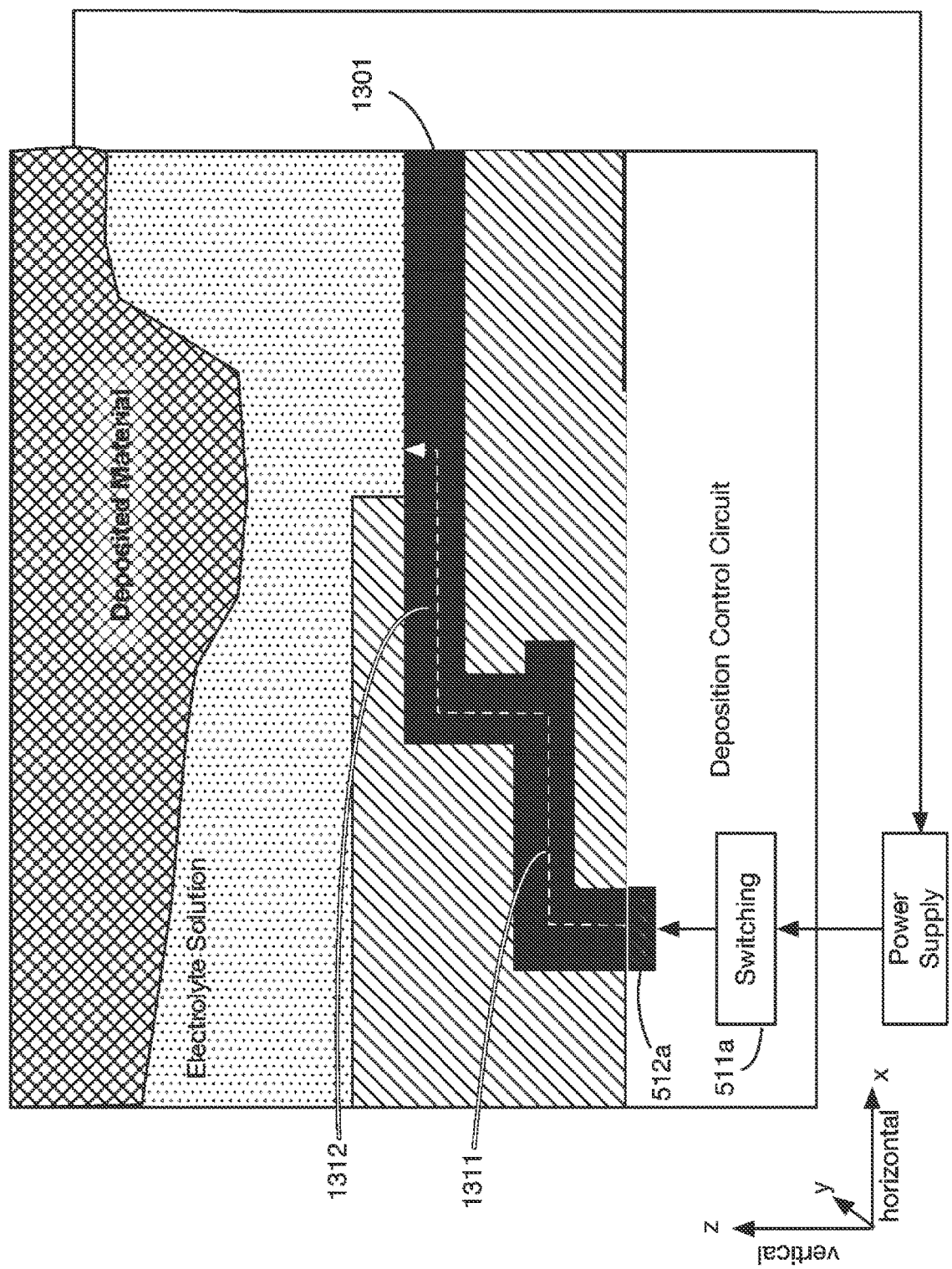

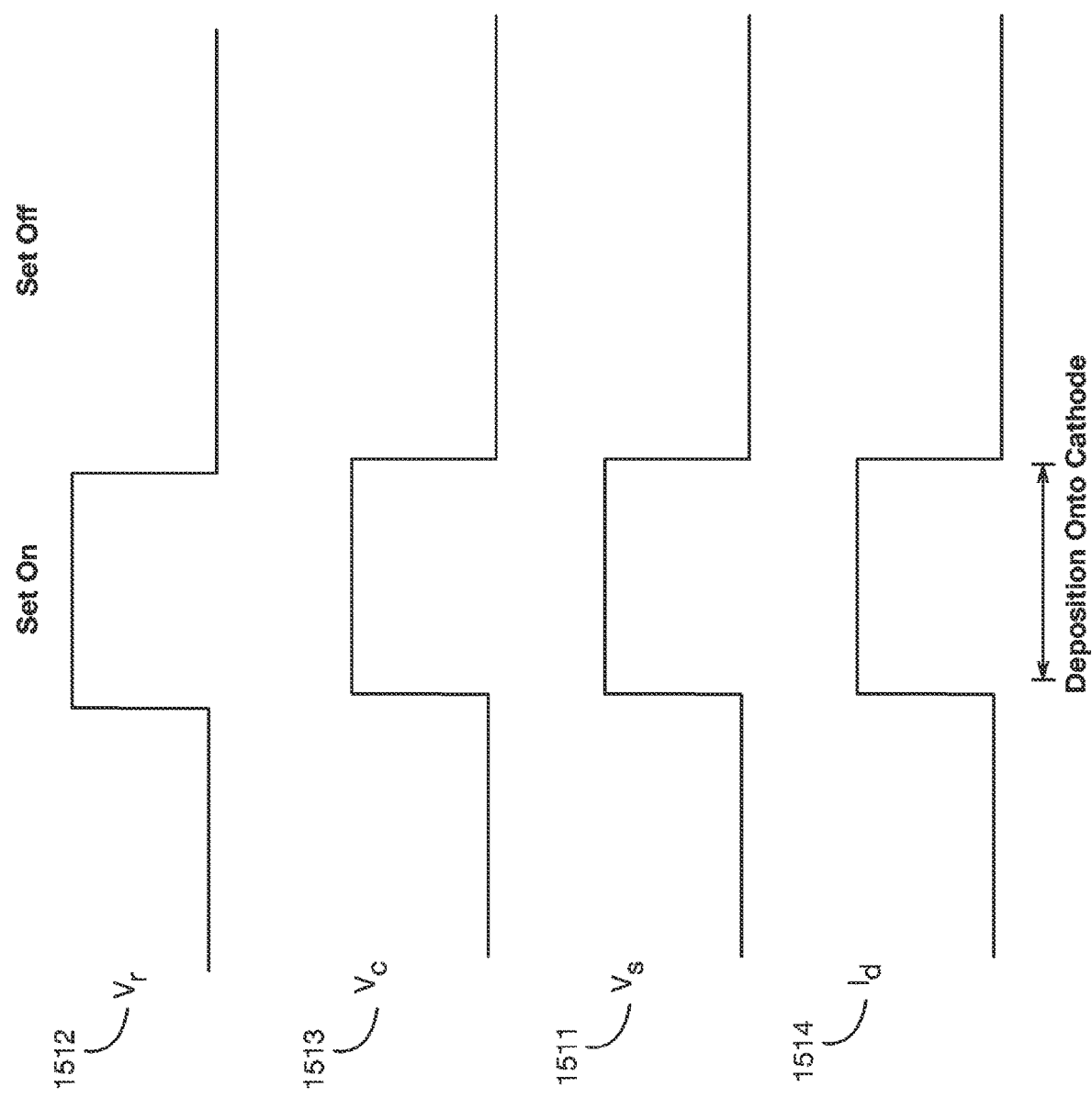

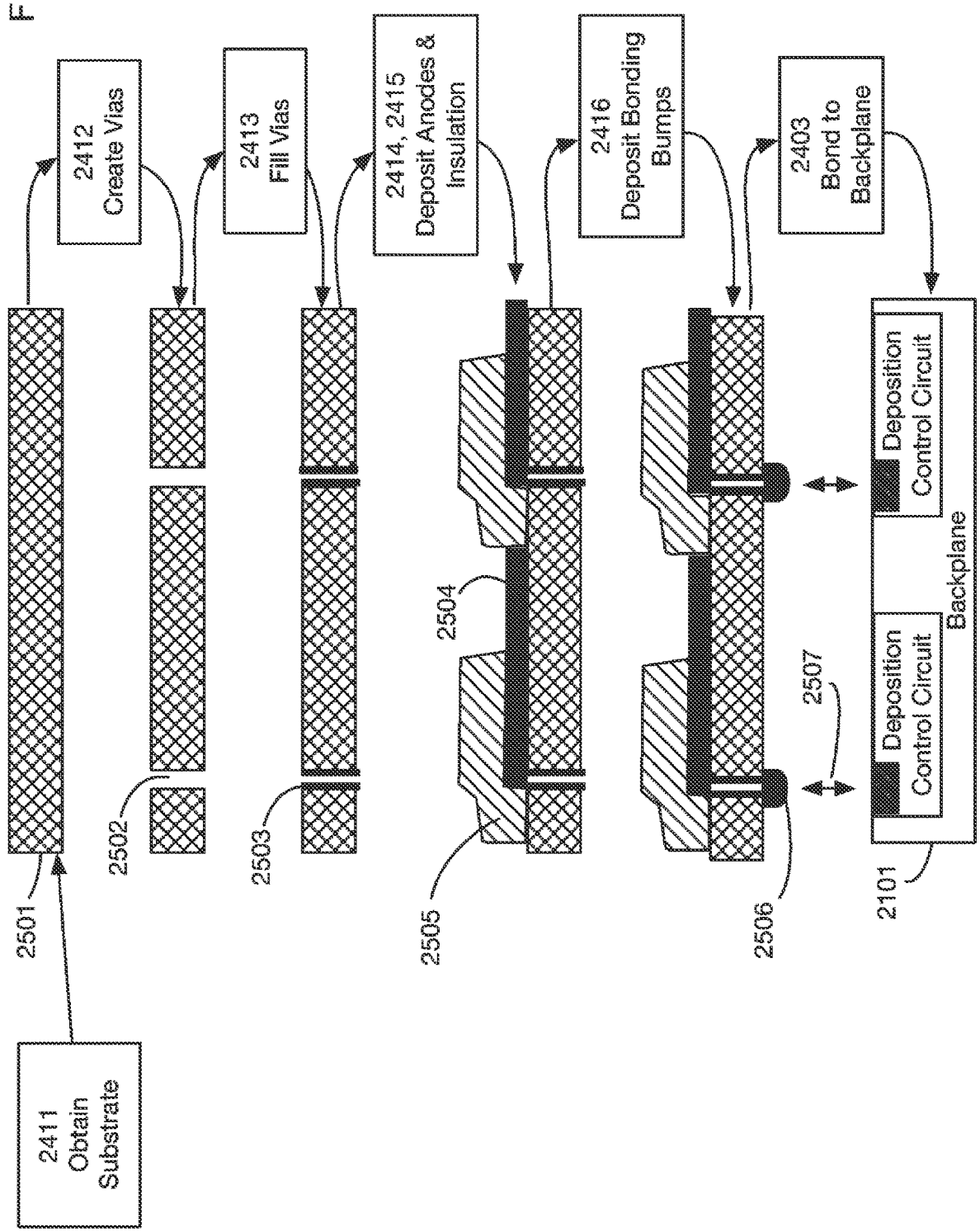

METHOD FOR MANUFACTURING AN ELECTROCHEMICAL DEPOSITION PRINTHEAD WITH GRID CONTROL CIRCUIT AND BACKPLANE

This application is a continuation of U.S. Utility patent application Ser. No. 17/099,602, filed Nov. 16, 2020, which is a continuation of U.S. Utility patent application Ser. No. 16/926,598, filed Jul. 10, 2020, which is a continuation-in-part of U.S. Utility patent application Ser. No. 16/795,495, filed Feb. 19, 2020, which claims the benefit of U.S. Provisional Patent Application Ser. No. 62/890,815, filed Aug. 23, 2019, the specifications of which are hereby incorporated herein by reference.

BACKGROUND OF THE INVENTION

One or more embodiments of the invention are related to the fields of electronics and 3D printing. More particularly, but not by way of limitation, one or more embodiments of the invention enable a method for manufacturing a printhead of an electrochemical additive manufacturing system.

Additive manufacturing, also known as 3D Printing, is often used for the production of complex structural and functional parts via a layer-by-layer process, directly from CAD (computer aided drafting) models. Additive manufacturing processes are considered additive because materials are selectively deposited on a substrate to construct the product. Additive manufacturing processes are also typically layered meaning that layers of the product to be produced are fabricated sequentially.

Currently, widespread use of metal additive manufacturing techniques is limited due to the high cost associated with selective laser melting (SLM) and electron beam melting (EBM) systems. Further, most metal additive manufacturing devices currently in the industry use powdered metals which are thermally fused together to produce a part, but due to most metals' high thermal conductivity this approach leaves a rough surface finish because unmelted metal powder is often sintered to the outer edges of the finished product.

An emerging alternative for additive metal manufacturing is to use electrochemical reactions. In an electrochemical manufacturing process, a metal part is constructed by plating charged metal ions onto a surface in an electrolyte solution. This technique relies on placing a deposition anode physically close to a substrate in the presence of a deposition solution (the electrolyte), and energizing the anode causing charge to flow through the anode. This creates an electrochemical reduction reaction to occur at the substrate near the anode and deposition of material on the substrate. An illustrative apparatus that enables additive manufacturing via electroplating is described for example in U.S. Pat. No. 10,465,307, "Apparatus for Electrochemical Additive Manufacturing," by the inventors of the instant application. This apparatus demonstrated a novel approach to electrochemical additive manufacturing that uses a printhead with an array of anodes to build portions of each layer of a part in parallel, instead of moving a single anode across a part to sequentially construct portions of the layer.

BRIEF SUMMARY OF THE INVENTION

To address the shortcomings in the art, the inventors of embodiments of the invention have discovered that enormous improvements in part resolution may be achieved by adapting aspects of 2D display driver technology to electrochemical manufacturing which is unknown in the art. 2D displays such as large LCD screens have some similar issues to anode arrays, as display manufacturers have been continually increasing display pixel count and reducing pixel sizes. To achieve these improvements, 2D display drivers have typically used matrix-controlled backplanes (either passive matrix or active matrix), which use a grid of row and column control traces rather than separate control traces running to each pixel. The inventors have adapted matrix control to anode arrays to achieve the desired increases in array resolution and reductions in anode size. The matrix architecture greatly reduces the number of signal connections to the anode control circuits. For instance, in a 512× 480 electrode array, direct control of each anode would require 245,760 traces, whereas matrix control via row and column traces requires only 992 traces.

Although the inventors have adapted a matrix control architecture for anode arrays, existing designs for matrix-controlled 2D display drivers are not suitable for anode arrays, since the design objectives for display screens and electrochemical anode arrays are radically different. Major differences include: (1) display drivers control pixels, while the 3D printhead driver control anodes; (2) display driver backplanes are designed to occupy minimum space in each pixel so that the majority of the pixel area may be transparent (e.g., for LCDs) or light-emitting (e.g., for OLEDs), while anode arrays should occupy a large fraction of the grid space to drive the electrochemical reactions; (3) anode arrays must be exposed to an electrolyte solution, while pixel arrays are protected and generally not exposed to anything but air; (4) display drivers are designed to consume the least amount of energy possible, while anode arrays are specifically designed to deliver the maximum amount of current through the anodes. To address these differences, the inventors have developed novel matrix-controlled 3D printhead embodiments optimized for electrochemical reactions, rather than for pixel displays. In particular, embodiments of the printhead are optimized for high current density, which directly affects the rate at which a part can be built by electroplating.

One or more embodiments are related to a matrix-controlled printhead for an electrochemical additive manufacturing system. The printhead may be used for example as part of an additive 3D manufacturing system that constructs metal parts using electroplating. The printhead may contain elements that drive the electroplating reaction, such as anodes that are placed into an electrolyte, and control circuits that control the amount of current flowing through each anode to generate the desired shape of the constructed part. The printhead may support high density of the anode array to generate high quality parts with very fine details.

In one or more embodiments, the printhead may have a deposition grid that is partitioned into grid regions along x-axis and y-axis directions. The grid may be characterized by its grid x resolution (number of grid regions along the x-axis direction), grid y resolution (number of grid regions along the y-axis direction), grid x pitch (length of a grid region along the x-axis direction), grid y pitch (length of a grid region along the y-axis direction), overall grid pitch (minimum of grid x and grid y pitches), and grid region area. In one or more embodiments, the grid x and y resolutions may be 100 and in other embodiments 200 or more or 400 or more. In one or more embodiments, the grid x and y pitches may be 100 microns or less and in other embodiments may be 50 microns or less.

The printhead may include components such as a grid control circuit, a power distribution circuit, and an array of deposition elements aligned with the deposition grid. The grid control circuit may be organized for example as a matrix of an array of row traces and an array of column traces, with a row driver circuit electrically connected to each row trace, and a column driver circuit electrically connected to each column trace. Each deposition element may correspond to a unique grid region of the deposition grid; it may have a deposition anode and a deposition control circuit.

The deposition anode may be made for example of an insoluble conductive material. Illustrative insoluble conductive materials may include for example, without limitation, platinum group metals and their associated oxides, doped semiconducting materials, and carbon based conductors. The deposition anode may have an exposed surface that is configured to be placed in contact with an electrolyte. There may be a conductive path through the deposition anode to the exposed surface. The deposition anodes may for example be one or more layers of the insoluble conductive material added on top of the layer or layers of the deposition control circuits.

Each deposition control circuit may be connected to the corresponding deposition anode, to a row trace, to a column trace, and to the power distribution circuit. The deposition control circuit controls the conductivity or the amount of current flowing through the conductive path of the associated deposition anode. When this current flows through the deposition anode, it may flow to the exposed surface of the anode. When the exposed surface of the anode is in contact with the electrolyte, the current may cause an electrochemical deposition reaction on the cathode that builds the desired part. There may be one or more insulating layers between the deposition control circuit and the electrolyte, for example to protect the deposition control circuit.

In one or more embodiments, the deposition control circuit, the power distribution circuit, and the deposition anode may be configured to supply a relatively high current density, defined for example as the amount of current flowing through a deposition anode divided by the grid region area. For example, when the deposition control circuit sets the current flow through the deposition anode to the maximum level, the current density in one or more embodiments may be 125 mA per square centimeter or more; in one or more embodiments the current density may be 250 mA, 500 mA, 750 mA, 1000 mA per square centimeter or more.

In one or more embodiments, the length of the conductive path through a deposition anode may be 10% or more of the grid pitch. This relatively long conductive path may for example extend the usable life of the anode.

In one or more embodiments, the power distribution circuit may be a lattice of conductive power traces aligned with the deposition grid. These power traces may be connected at points where they cross one another. The width of these power traces in one or more embodiments may be 10% or more of the grid pitch. The power distribution circuit may have a layer of copper for example that is at least one micron thick. In one or more embodiments the power distribution circuit may be a solid plane of conductive material, or a plane of conductive material that is nearly solid (for example with some holes for mounting or routing). The power distribution circuit may have power supply connections on two or more sides.

In one or more embodiments, a deposition anode may have one or more sections that extend horizontally (along a horizontal axis parallel to the deposition grid) and that are covered by one or more insulating layers. The horizontal length of each section may be 10% or more of the grid pitch. In one or more embodiments these sections may have two or more layers at different vertical depths (along an axis perpendicular to the deposition grid). The exposed surface of the deposition anode may be offset horizontally along the horizontal axis from the point where the anode connects to the deposition control circuit. This horizontal offset may be 10% or more of the grid pitch.

One or more embodiments may have two (or more) layers of deposition anode, each horizontally offset from the previous layer. For example, a deposition anode may have a first layer that includes a connection between the anode and the deposition control circuit, and a horizontal section that extends away from this connection. It may then have a second layer that includes a via connecting the second layer to the first layer, with a second horizontal section that extends away from this via toward the exposed surface of the anode. The exposed surface may be offset horizontally from the via, and the via may be horizontally offset from the connection to the deposition control circuit.

In one or more embodiments, the area of the exposed surface of a deposition anode may be 15% or more of the grid region area.

In one or more embodiments, a deposition control circuit may have a first switching element controlled by the row trace, and a second switching element controlled by the column trace when the first switching element is active. The second switching element may control the amount of current flowing through the conductive path of the deposition anode. The switching elements may be for example thin film transistors. They may be made for example of low-temperature polycrystalline silicon. In one or more embodiments they may be made of indium gallium zinc oxide.

In one or more embodiments a deposition control circuit may also have a storage capacitor that is charged when the first switching element is active and when the associated column trace is energized. The storage capacitor may maintain the state of the second switch element after the first switching element is deactivated.

In one or more embodiments, the printhead may be configured to connect to a processor that sets the signals on the row traces and column traces via the row driver circuit and column driver circuit of the printhead. The processor may receive layer slice information describing desired deposition of material onto the cathode, and may set row and column trace signals based on this layer slice information to control the amount of current flowing through the conductive path of each deposition anode. In one or more embodiments the processor may also control a positioning actuator that controls the distance between the array of deposition elements and the cathode. In one or more embodiments the processor may receive data from one or more sensors to determine when the desired deposition of material onto the cathode by each deposition element is complete for a layer; illustrative sensors may include for example a current sensor, a voltage sensor, a force sensor, a pressure sensor, and a timer.

One or more embodiments of the invention may enable a process for manufacturing a printhead of an electrochemical additive manufacturing system. Manufacturing the printhead may include coupling one or more layers to a backplane, such as one or more insulating layers and one or more anode layers; these layers may be coupled to the backplane for example by depositing them onto the backplane, or by manufacturing one or more separate components that are then bonded to the backplane. The backplane may contain an array of deposition control circuits aligned with a deposition grid. It may also have a grid control circuit, which may include an array of row traces coupled to a row driver circuit, and an array of column traces coupled to a column driver circuit. It may also have a power distribution circuit. Each deposition control circuit may be coupled electrically to the power distribution circuit and to an associated row trace and column trace. The coupling of the insulating and anode layers to the backplane may result in each anode of the anode layer being coupled electrically to at least one corresponding deposition control circuit through an opening in one or more of the insulating layers.

In one or more embodiments, the manufacturing process may deposit layers onto the backplane to form the completed printhead. These layers may include for example a first insulating layer, an anode layer on top of the first insulating layer, and a second insulating layer on top of the first insulating layer and the anode layer. The first insulating layer may cover portions of the backplane but may leave uncovered a contact pad associated with each deposition control circuit. The anode layer may include an array of deposition anodes made of an insoluble conductive material, each coupled electrically to a corresponding contact pad of at least one corresponding deposition control circuit. The second insulating layer may cover portions of the anode layer except for an exposed surface of each deposition anode, which is configured to contact an electrolyte.

In one or more embodiments, the first insulating layer may have an average thickness of at least 100 nanometers, the anode layer may have an average thickness of at least 50 nanometers, and the second insulating layer may have an average thickness of at least 100 nanometers. In one or more embodiments, the first insulating layer may have an average thickness of at least 800 nanometers, the anode layer may have an average thickness of at least 800 nanometers, and the second insulating layer may have an average thickness of at least 1500 nanometers. In one or more embodiments, the first insulating layer may have an average thickness of at least 800 nanometers, the anode layer may have an average thickness of at least 1600 nanometers, and the second insulating layer may have an average thickness of at least 2000 nanometers.

In one or more embodiments, the insoluble conductive material of the deposition anodes may include one or more of platinum group metals and their associated oxides, highly doped semiconducting materials, and carbon based conductors; one or both of the insulating layers may include one or both of silicon nitride and silicon dioxide.

In one or more embodiments, any or all of the layers may be deposited onto the backplane using one or more of chemical vapor deposition and physical vapor deposition.

An illustrative process for depositing the anode layer that may be used in one or more embodiments may include depositing a seed material, applying a mask over portions of the seed material that correspond to the desired pattern of the deposition anode array, removing the seed material that is not covered by the mask, removing the mask, and depositing the insoluble conductive material on the remaining seed material using chemical vapor deposition. The insoluble conductive material may include for example boron doped diamond.

Another illustrative process for depositing the anode layer that may be used in one or more embodiments may include depositing the insoluble conductive material using chemical vapor deposition, applying a mask over portions of the conductive material that correspond to the desired pattern of the deposition anode array, removing conductive material that is not covered by the mask, and removing the mask. The insoluble conductive material may include for example boron doped diamond.

Another illustrative process for depositing the anode layer that may be used in one or more embodiments may include applying a photoresist layer on top of the first insulating layer, removing the photoresist in regions corresponding to the desired pattern of the deposition anode array, depositing the insoluble conductive material on top of the first insulating layer and the photoresist using physical vapor deposition, and removing the photoresist and the insoluble conductive material on top of the photoresist. The insoluble conductive material may for example include one or more of platinum group metals and their associated oxides.

Another illustrative process for depositing the anode layer that may be used in one or more embodiments may include depositing the insoluble conductive material using physical vapor deposition, applying a mask over portions of the conductive material corresponding to the desired pattern of the deposition anode array, removing the insoluble conductive material not covered by the mask, and removing the mask. Removal of the insoluble conductive material not covered by the mask may for example include etching, which may include wet etching or dry etching.

In one or more embodiments, a printhead may be manufactured by obtaining a backplane (such as the backplane described above), manufacturing a separate anode plane, and then bonding the anode plane to the backplane. The anode plane may be manufactured by obtaining a substrate, creating an array of vias between the top side and bottom side of the substrate, filling the vias with electrically conductive via material, depositing an anode layer onto the top side of the substrate so that each deposition anode is coupled electrically to at least one corresponding via, depositing an insulating layer on top of the anode layer and leaving an exposed surface of each deposition anode to contact an electrolyte, and depositing an array of bonding bumps on the bottom side of the substrate that are each coupled electrically to a corresponding via. The anode layer may be deposited onto the substrate using for example chemical vapor deposition or physical vapor deposition. In one or more embodiments, bonding of the anode plane to the backplane may be done using one or more of eutectic bonding, thermocompression bonding, or controlled collapse solder bonding, or by joining the two using an anisotropic conductive adhesive.

BRIEF DESCRIPTION OF THE DRAWINGS

The above and other aspects, features and advantages of the invention will be more apparent from the following more particular description thereof, presented in conjunction with the following drawings wherein:

in FIG. 4A, a layer of deposition anodes is constructed above a grid of deposition control circuits; in FIG. 4B, the deposition anodes are integrated into the grid of deposition control circuits.

FIG. 5 shows an illustrative set of layers for the approach described in FIG. 4A; anode and insulation layers are constructed above the deposition control circuits layer.

FIG. 6 shows a different embodiment of deposition anodes that uses a deep vertical layer of deposition anodes to increase deposition anode lifetime.

FIG. 9 shows a potential benefit of the horizontally offset deposition anodes illustrated in FIGS. 7 and 8: as anode material erodes, the anode can remain operational for a longer period of time.

FIGS. 10A and 10B show an illustrative shape of a horizontally offset deposition anode, shown from the top in FIG. 10A and in vertical cross section in FIG. 10B with the other layers of the 3D printhead.

FIG. 11A shows an illustrative mask for deposition anodes, along with vias in insulating layers that allow the deposition anodes to connect below to the deposition control circuits, and above to the electrolyte.

FIG. 11B shows successive addition of layers using the mask of FIG. 11A.

FIG. 12 shows a variation of the horizontally offset anode design of FIG. 7, with two layers of horizontally offset anode material.

FIG. 13 shows how the two layers of anode material of FIG. 12 increase the length of the conductive path from the deposition control circuit to the exposed surface of the anode.

FIG. 15B shows a timing diagram for control of current flow through the anode of FIG. 15A; this diagram illustrates that the duty cycle of an anode in a passive matrix configuration may be limited.

FIG. 17 shows the overall process; FIG. 18 shows the process to construct a single layer; and FIG. 19 shows the process to measure layer deposition and adjust the build process accordingly.

FIG. 25 illustrates the steps shown in FIG. 24.

DETAILED DESCRIPTION OF THE INVENTION

While effective in low resolution, the apparatus described in the '307 patent did not address certain challenges encountered in scaling electrochemical additive manufacturing to parts of very small feature size, with sufficient throughput to enable efficient part construction. Specifically, achieving smaller features requires a 3D printhead with smaller anodes packed more densely into the anode array of the printhead. The complexity of the control circuits and of the manufacturing process to create such anode arrays is prohibitive with existing approaches to printhead design. In particular, the apparatus described in the '307 patent relied on direct control over each electrode element, i.e. if an array consisted of an 8×8 grid of electrodes the controller would use 64 signal traces between the controller and the array. While this approach works for small electrode grids, routing and controlling individual control traces for each anode in a large, densely packed anode array may not scale to anode arrays of hundreds of thousands or millions of anodes.

For at least the limitations described above the inventors of the instant invention have realized that there is a need for a matrix-controlled printhead for an electrochemical additive manufacturing system. There is also a need for a manufacturing process for constructing such a printhead.

A matrix-controlled printhead for an electrochemical additive manufacturing system, and a manufacturing process to create such a printhead, will now be described. The printhead may be used for example in an apparatus that 3D prints metal parts using electrodeposition. The printhead may contain a dense 2D grid of anodes that provide a high density of current through an electrolyte to facilitate rapid 3D printing of metals in high resolution. In the following exemplary description, numerous specific details are set forth in order to provide a more thorough understanding of embodiments of the invention. It will be apparent, however, to an artisan of ordinary skill that embodiments of the invention may be practiced without incorporating all aspects of the specific details described herein. In other instances, specific features, quantities, or measurements well known to those of ordinary skill in the art have not been described in detail so as not to obscure the invention. Readers should note that although examples of the invention are set forth herein, the claims, and the full scope of any equivalents, are what define the metes and bounds of the invention.

Figure 1:
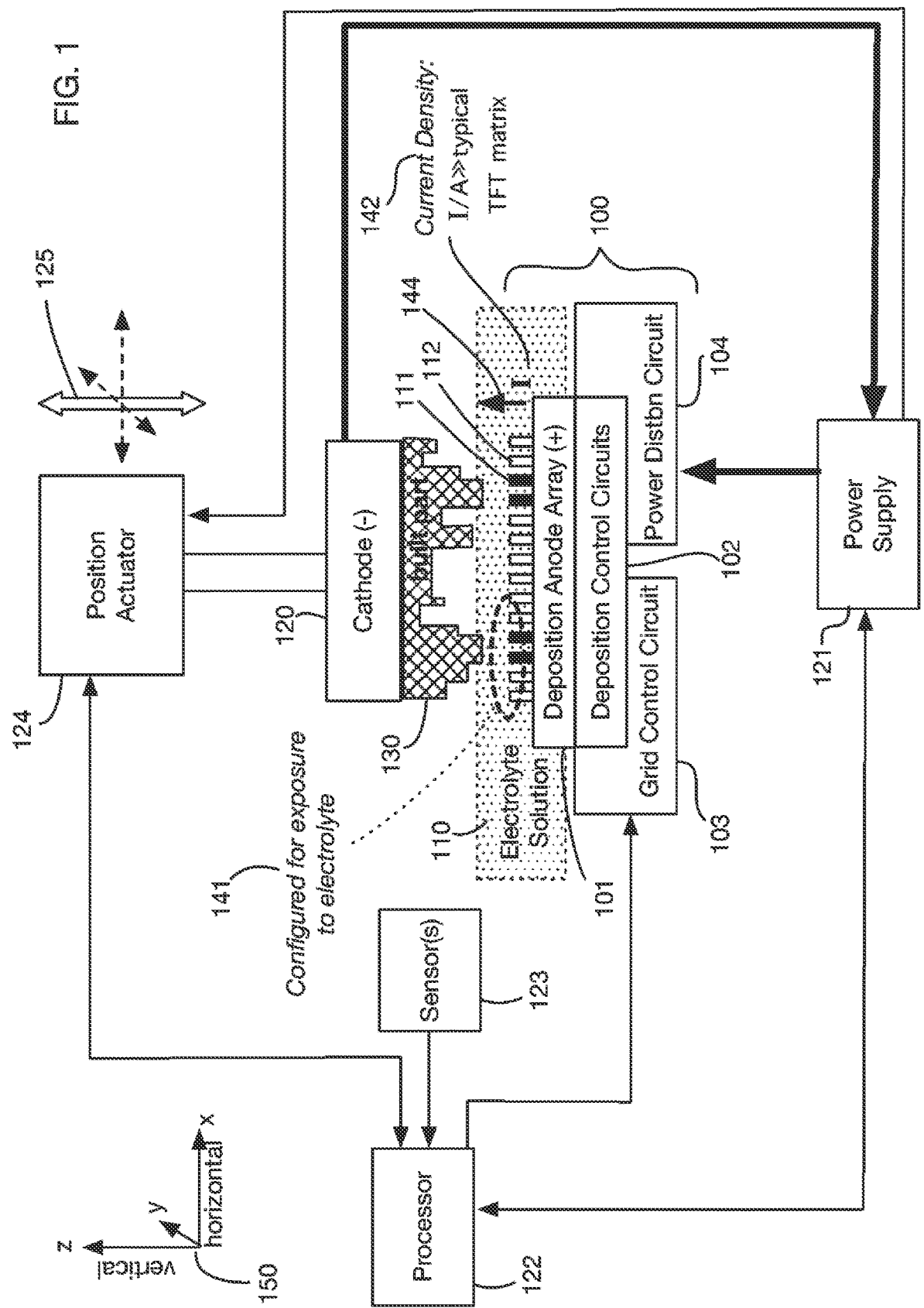
FIG. 1 shows a block diagram of an embodiment of an electrochemical additive manufacturing system with a matrix-controlled 3D printhead containing an anode array.

FIG. 1 shows an architectural diagram of a printhead 100 integrated into an illustrative electrochemical additive manufacturing system. The components and interconnections of the system are illustrative; a printhead as described in this application may be used in any type of system, including but not limited to a 3D printing system as shown in FIG. 1. Printhead 100 contains an array 101 of deposition anodes, and a corresponding array 102 of deposition control circuits for the deposition anodes. As described below, the deposition control circuits 102 may be organized in a matrix arrangement, thereby supporting high resolution anode arrays. The deposition anode array 101 may be organized in a two-dimensional grid, as shown in the figures below; FIG. 1 shows a cross sectional view. A grid control circuit 103 transmits control signals to the deposition control circuits 102 to control the amount of current flowing through each deposition anode in anode array 101. Current flowing through the anodes is provided by a power distribution circuit 104 that routes power from one or more power supplies 121 to the deposition control circuits and then to the anodes. Printhead 100 may also contain other elements such as insulation layers, as described below.

The deposition anode array 101 of printhead 100 may be placed in an electrolyte solution 110. Electrochemical reactions may then cause plating of metal onto a manufactured part 130 that is coupled to cathode 120. Intricate and detailed shapes may be built in part 130 by modifying the current flowing through each anode of deposition anode array 101. For example, in the snapshot shown in FIG. 1, anode 111 is energized, so that metal is being deposited onto part 130 near this anode, but anode 112 is not energized so no metal is being deposited near that anode.

In one or more embodiments, printhead 100 may be integrated with a processor 122. This processor may transmit signals to grid control circuit 103, which sends signals to the individual deposition control circuits 102 to turn anodes in deposition anode array 101 on or off (or to modify the intensity of current flow through each anode). Processor 122 may be for example, without limitation, a microcontroller, a microprocessor, a GPU, a FPGA, a SoC, a single-board computer, a laptop, a notebook, a desktop computer, a server, or a network or combination of any of these devices. Processor 122 may communicate with one or more sensors 123 that may be used to measure the progress of metal deposition on part 130. Sensors 123 may include for example, without limitation, current sensors, voltage sensors, timers, cameras, rangefinders, scales, force sensors, or pressure sensors. Either or both of cathode 120 and printhead 100 may be attached to one or more position actuators 124, which may control the relative position of the cathode and the deposition anode array. Position actuator 124 may control vertical movement 125, so that the cathode may be raised (or alternatively the anode lowered) as the part 130 is built in successive layers. In one or more embodiments position actuator 124 may also move the cathode or deposition anode array horizontally relative to one another, for example so that large parts may be manufactured in tiles.

Printhead 100 may be connected to a power supply (or multiple power supplies) 121, which supplies current 144 that flows through the deposition anode array to drive metal deposition on part 130. Current may be distributed throughout the array of deposition control circuits via power distribution circuit 104, which may for example include one or more power busses. The speed at which part 130 is built depends largely on the amount of current 144 that flows from the deposition anode array 101. To support efficient, rapid manufacturing of metal parts, one or more embodiments of printhead 100 may be configured to provide a very high current density 142, defined for example as the maximum amount of current 144 per area that can flow through a portion of deposition anode array 101, when that portion of the array is supplying maximum current. The high current density supported by one or more embodiments of the invention represents a significant advance over known devices. In particular, existing matrix-controlled anodes (such as those found in thin film transistor backplanes for displays) typically have current densities that are orders of magnitude lower than the current density provided by one or more embodiments of the invention.

In addition to the high current density 142 supported by printhead 100, the deposition anode array 101 is configured for exposure 141 to electrolyte solution 110. This feature of printhead 100 also represents a significant advance over known devices. Existing matrix-controlled arrays, such as those in display drivers, would not function and would be quickly destroyed in an electrolyte solution. The control circuits of those arrays might short-circuit, and even if parts were protected from short circuits, exposed parts might rapidly erode and decay when exposed to the electrolyte. Printhead 100 may be configured for robust operation in the environment of the electrolyte during an electrochemical reaction.

In one or more embodiments, the system may also include a fluid chamber to contain the electrolyte solution (not shown in FIG. 1), and a fluid handling system (also not shown). The fluid system may include for example a tank, a particulate filter, chemically resistant tubing and a pump. Analytical equipment may enable continuous characterization of bath pH, temperature, and ion concentration using methods such as conductivity, High Performance Liquid Chromatography, mass spectrometry, Cyclic Voltammetry Stripping, spectrophotometer measurements, or the like. Bath conditions may be maintained with a heater and/or an automated replenishment system to replace solution lost to evaporation and/or ions of deposited material.

Although the system shown in FIG. 1 has a single array of deposition anodes, one or more embodiments may incorporate multiple deposition anode arrays. These multiple anode arrays may for example operate simultaneously in different chambers filled with electrolyte solution, or they may be tiled in a manner where the anode arrays work together to deposit material on a shared cathode or series of cathodes.

Reference frame 150 in FIG. 1 shows axes that are used in subsequent figures to indicate the orientation from which the parts of printhead 100 are viewed. The vertical z-axis of frame 150 is the direction along which current generally flows from deposition anode array 101 to cathode 120. Deposition anode array 101 may be organized as a horizontal grid along the x and y axes, as described below.

Figure 2:
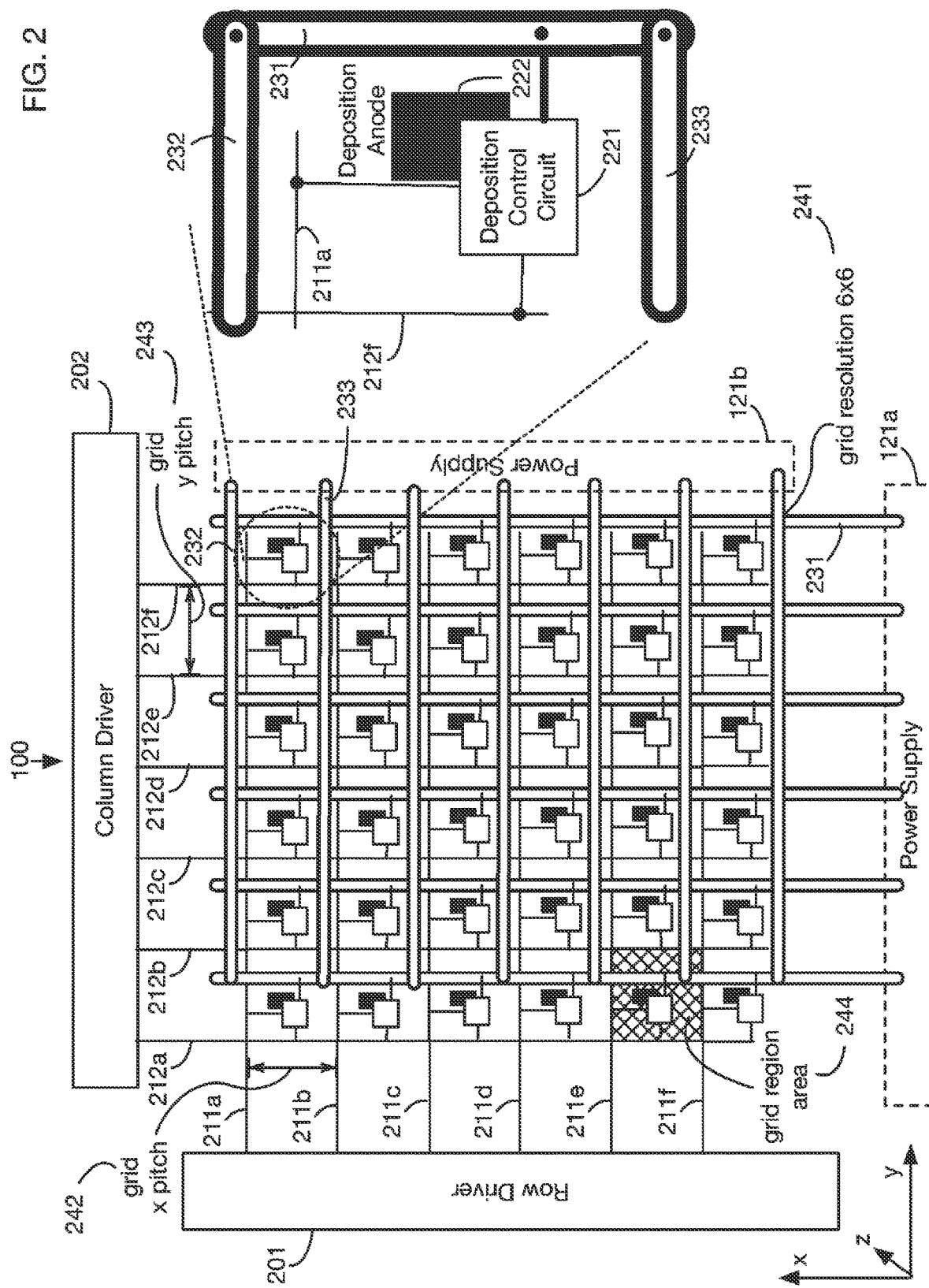
FIG. 2 shows a conceptual circuit diagram of a small 6×6 grid of anode control circuits that control a corresponding array of deposition anodes.

FIG. 2 shows a diagram of selected elements of an illustrative matrix-controlled printhead 100. For ease of exposition, a very small printhead of resolution 6×6 is shown, and a closeup view is shown of the deposition element in the upper right corner. In applications, embodiments of the printhead may contain thousands or millions of deposition elements. Deposition elements of the printhead may be aligned with a two-dimensional grid. The grid may be partitioned along two axes (labeled as the x-axis and y-axis in FIG. 2) into grid regions. Associated with each grid region may be a deposition element that may include a deposition anode and a deposition control circuit. Grids may be of any size, resolution, and shape. Grid regions may be uniform, or they may vary across the grid. Density of deposition elements may vary across the grid in one or more embodiments. Deposition elements may be aligned with the grid at any points and in any directions or orientations.

The grid on which deposition elements are aligned has a resolution 241, which indicates the number of grid regions along the x axis (x resolution) and along the y axis (y resolution). In one or more embodiments, grids may not be regularly spaced throughout the grid, and resolution may vary across grid regions. For a regular grid such as that shown in FIG. 2, each grid region has an associated grid x pitch 242 (the length of a grid region along the x axis), an associated grid y pitch 243 (the length of a grid region along the y axis), and an associated grid region area 244. For a rectangular grid region, the grid region area 244 may be for example the product of the x-pitch 242 and the y-pitch 243. In one or more embodiments, grid regions need not be rectangular, the grid dimensions may be for example maximum or average diameters along different axes, and the grid region area may be defined as the area occupied by a grid region of any shape. A grid pitch may also be associated with the grid; the pitch may be for example the minimum of the grid x pitch and the grid y pitch. In this description and in other descriptions in this application, the dimensions x and y and the definitions of row and column may be swapped by the designer.

The matrix-controlled architecture of the printhead allows the grid to scale to very large sizes. Grid sizes may be for example at least 400×400 in one or more embodiments. Individual grid regions may have x pitch and y pitch of 50 microns or less in one or more embodiments.

The printhead 100 of FIG. 2 is matrix-controlled by a grid control circuit that contains an array of row traces 211a through 211f and an array of column traces 212a through 212f. Each deposition control circuit is connected to one associated row trace and to one associated column trace. For example, illustrative deposition control circuit 221 is connected to row trace 211a and to column trace 212f. This deposition control circuit 221 controls the flow of current to the associated deposition anode 222. The current flow through the anode is controlled by signals on the associated row trace and column trace, as described below. Deposition control circuit 221 provides functionality to control conductivity or turn the associated deposition anode 222 on or off or to modify the amount of current flowing through anode 222. The circuit 221 may be in a conducting state, when current flows through deposition anode 222, or in a non-conducting state, when current does not flow through deposition anode 222. (A small amount of leakage current may flow even in the non-conducting state.) In one or more embodiments the deposition control circuit may provide control of the amount of current that flows through the deposition anode, rather than just binary on/off control.

Row traces 211a through 211f are connected to row driver 201, and column traces 212a through 212f are connected to column driver 202. The row and column drivers set the signals on the row and column traces, respectively, to control the entire set of deposition control circuits in the printhead. The matrix control provided by the row and column grid structure of the printhead simplifies wiring, since individual control traces need not be routed to every individual deposition control circuit. This simplification allows the printhead to scale up to large size arrays with very small grid regions, enabling manufacturing of large parts with very small feature size. The repeating pattern of the grid may also simplify manufacturing and scaling of the printhead.

Row traces and the column traces may be both driven by gate row driver integrated circuits (ICs) and column driver ICs. These gate and source driver ICs may be for example Serial In Parallel Out (SIPO) shift registers whose inputs are digital control signals that control each of the row and column drivers' outputs. In certain configurations these drive IC's may be discrete components that are bonded to the deposition element array, but in others this drive circuitry may be embedded into the edges of the electrode array itself. In some embodiments, the row and/or column drivers may be high voltage drivers, which may increase the amount of power flowing through the deposition element array thereby maximizing the rate at which parts may be built.

In one or more embodiments, the row driver IC and the column driver IC may be installed with their outputs driving in an open-ended configuration into the array, with the row traces being perpendicular to the column traces, thus driving the active area from two sides only. In other embodiments, the device may have additional column driver ICs and row driver IC's with some configurations having row driver ICs on two sides and column driver ICs on two sides. Such configurations may be used to increase the amount of power supplied (or increase power uniformity) into a given row or column trace, as a given trace may be driven by the outputs of two drive ICs rather than one. In this configuration, active area driving may be provided on all four sides of the active area. One or more embodiments may have double ended supply of either the row or column traces while remaining single ended on the other (either row or column) supply traces.

It is also possible to utilize techniques such as supplying the gate and column traces from multiple sides, with a given row or column trace not being connected all the way through the active area, thus allowing row or column drive ICs installed on opposite sides of the active area to be independently driving the active area rather than having sets of drive ICs concurrently driving the same traces. In this way, subsets of drive ICs may independently address different regions of the active area which may provide benefits such as faster addressing of the array. In some embodiments, every other row or column may be driven from opposite sides, for example.

Row driver ICs and column driver ICs may be selected and configured such that their output drive voltages are capable of addressing the switch elements in the deposition element array, relative to the main process (power supply) voltage. For embodiments that use for example N-Type Field Effect Transistors (FETs) as switching elements, the voltage supplied to the gate should exceed a threshold voltage which is defined as the input voltage of the transistor drain contact plus an additional voltage value which is defined by the semiconductor material and other transistor parameters. This threshold voltage is often up to 3V. In an example where the process voltage is 5V, the gate voltage should be greater than the process voltage plus the threshold voltage, in this case at least 8V to cause the FET to allow charge to flow. Additionally, the addressing switching element should now be given sufficient voltage at its gate to enable this 8V voltage to flow through to the gate of the main switching element. In this example, the voltage supplied to the gate of the addressing switch element could also have a threshold voltage of 3V, requiring its gate voltage to be 11V or greater to allow charge to flow.

In the embodiment shown in FIG. 2, the grid for the printhead deposition elements coincides with the grid defined by the row traces and the column traces. In one or more embodiments, the grid of deposition elements may be aligned in any desired manner relative to row traces and column traces. In one or more embodiments, row traces and column traces need not be evenly spaced or straight, and row and column traces need not be perpendicular.

Printhead 100 has a power distribution circuit that contains a lattice of power traces, which are electrically connected to power supplies 121a and 121b. One or more embodiments may distribute power throughout the grid using any type of power grid, busses, backplane, or routing circuits. For example, in one or more embodiments instead of the power trace lattice shown in FIG. 2, a power backplane may be used, which may be for example a continuous solid plane of copper parallel to the grid. The power distribution circuit may be connected to one or more power supplies in multiple locations, for example at different edges of the grid; the illustrative embodiment shown in FIG. 2 has connections to power supply 121a on the lower edge of the power trace lattice, and separate connections to power supply 121b on the right edge of the power trace lattice.

In one or more embodiments, the power lattice may be partitioned into multiple sublattices, each of which may be driven by a separate power supply for example. Power traces may consist for example of vertical and horizontal power busses that are electrically connected at each crossover point. Each deposition control circuit may be connected to the power trace lattice at one or more points. For example, deposition control circuit 221 is connected to vertical power trace 231. The crossbar (horizontal) power traces, such as traces 232 and 233, may assist in distributing power evenly throughout the grid, for example with connections to vertical trace 231 and other vertical traces. Effectively the lattice of interconnected vertical and horizontal power traces may serve as an integrated power bus that routes power efficiently to any or all of the individual deposition control circuits in the grid. This power trace lattice architecture may for example contribute to the high current density achieved by one or more embodiments of the printhead. This architecture represents a significant change from lower current matrix-controlled circuits such as display drivers, where it is undesirable and typically unnecessary to have a high current capacity lattice of power traces.

In one or more embodiments, the width of the power traces may also contribute to high current density of the printhead. For example, in one or more embodiments the power traces may have a width in a substrate plane that is 10% or greater of the grid pitch. The thickness of power traces may also be set to increase current density; for example, in one or more embodiments the power traces may have a thickness (perpendicular to the substrate) of one micron or more. Power traces may also be constructed of a highly conductive material such as copper, molybdenum, aluminum, or the like. In one or more embodiments, power traces may be manufactured as one or several additional metal layers on top of the switching or charge storage elements, underneath the switching or charge storage elements, or using a conductive material as a substrate on top of which to fabricate the device. In one or more embodiments, power traces may also be fabricated in between row traces on a metal layer and/or between column traces on a metal layer. There may be multiple power busses for example, which could allow for measuring current at multiple deposition anodes simultaneously.

Another method that may be used in one or more embodiments to increase the current density is to rearrange the location of the external power supply connections relative to the array. In some embodiments, power supply traces may be externally connected to the device in multiple locations to increase electrical current across the entirety of the device.

The combination of any or all of these factors—a lattice of power traces (or a single power backplane containing a solid conductive plane), power traces with substantial width relative to the grid pitch, power trace layers of substantial thickness, use of highly conductive materials, separate power trace layers, and arrangement of power connections to supply current from multiple locations—may for example contribute to current densities for one or more embodiments of the invention that are orders of magnitude greater than that of traditional matrix-control circuits for applications such as displays. For example, in one or more embodiments the current density of a printhead, defined for example as the potential current output by a deposition anode divided by the grid area, may be 125 milliamps per square centimeter or more, with densities of 1000 milliamps per square centimeter or more in one or more embodiments. In contrast, typical display drivers have current densities of substantially less than 100 milliamps per square centimeter.

Figure 3A:
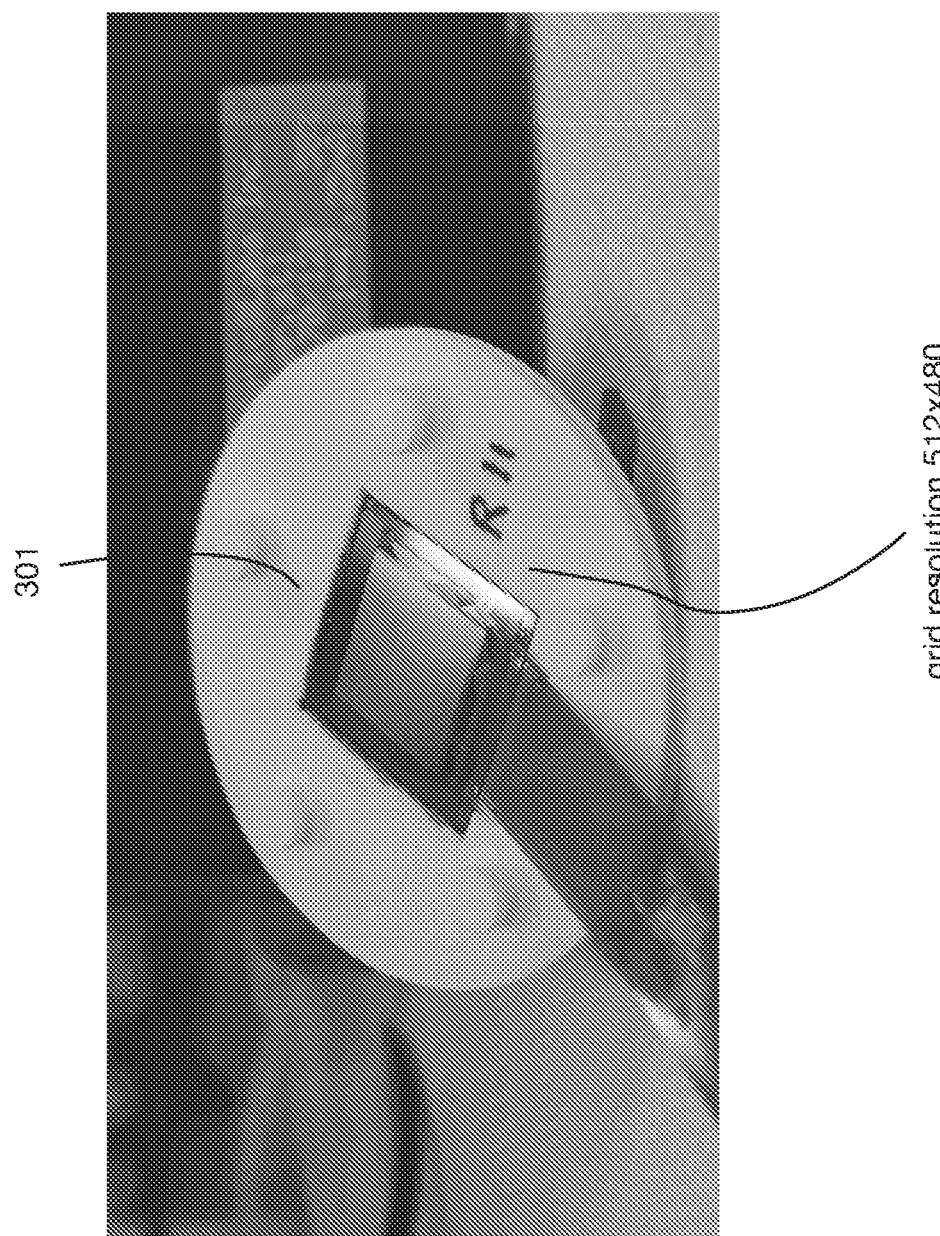
FIG. 3A shows a photograph of an implementation of an embodiment of a matrix-controlled 3D printhead with a resolution of 512×480 and a grid pitch of 50 microns.

FIG. 3A shows a photograph of an illustrative printhead 301. This printhead has a grid resolution of 512×480, and a grid pitch of 50 microns. It is constructed on a rigid glass substrate approximately 0.5 mm thick. At the outer edges of the deposition element array on the glass substrate, the column addressing and row addressing traces may be exposed in a series of contact pads. Along with these, contact pads for various power supply and communications may also be exposed. Row driver ICs and column driver ICs may then be bonded to these exposed contact pads using a suitable adhesive such as an anisotropic electrically conductive adhesive consisting of conductive particles suspended in an epoxy resin. A flexible cable that delivers the various power supplies and data signals to the device from external circuitry may also be assembled to the device using a similar adhesive such as an anisotropic electrically conductive adhesive. The printhead may be integrated into a plastic carrier for further integration with a deposition system.

Figure 3B:
FIG. 3B shows an illustrative metal part created using the printhead of FIG. 3A.

FIG. 3B shows a photograph of a metal part (with a one inch scale indicated) that was manufactured with printhead 301 integrated into an electrochemical additive manufacturing apparatus such as the apparatus shown in FIG. 1.

Figure 4A:
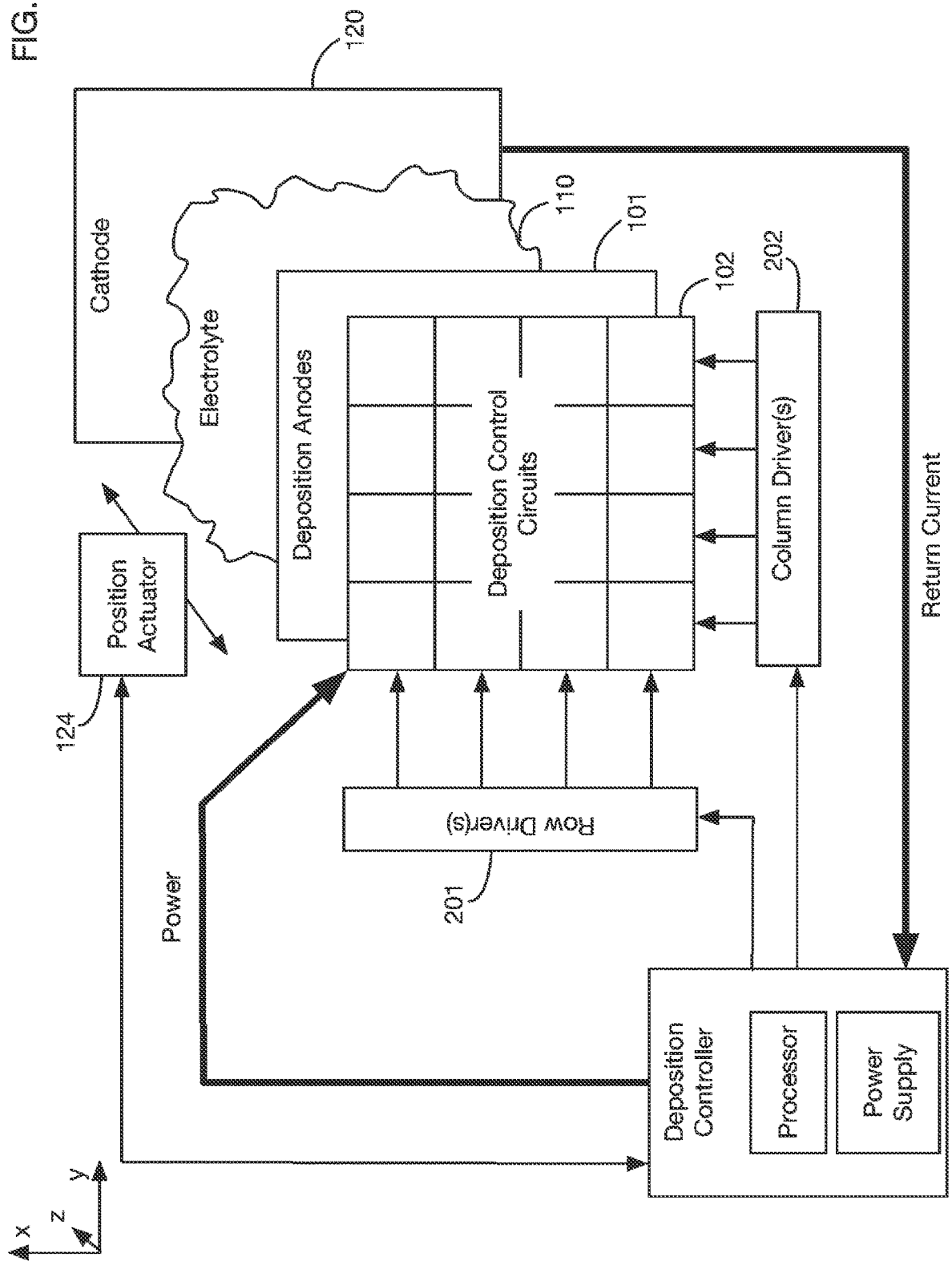
FIGS. 4A and 4B show two approaches that may be used in one or more embodiments to construct the 3D printhead.

FIGS. 4A through 14 describe various approaches for designing and constructing the circuitry of the printhead that may be used in one or more embodiments. FIGS. 4A and 4B show two different approaches that may be used. In the embodiment shown in FIG. 4A, deposition anodes 101 are configured as a separate layer or layers above (closer to the cathode) a layer or layers of deposition control circuits 102. For example, the deposition control circuits may be fabricated using typical thin film semiconductor manufacturing processes (such as those used to create display backplanes), and the deposition anodes may be separately manufactured on top of the deposition control circuits. Electrical connections between the deposition anodes and the deposition control circuits may be made for example using vias that connect the control circuits to the anodes. Alternatively, the deposition anode layer or layers may be constructed first, and the deposition control circuits may be added below the anode layer or layers afterwards. Regardless of the order of manufacturing steps, in operation the deposition anodes 101 contact the electrolyte 110, but the deposition control circuit layer(s) are isolated (electrically and chemically) from the electrolyte.

Figure 4B:
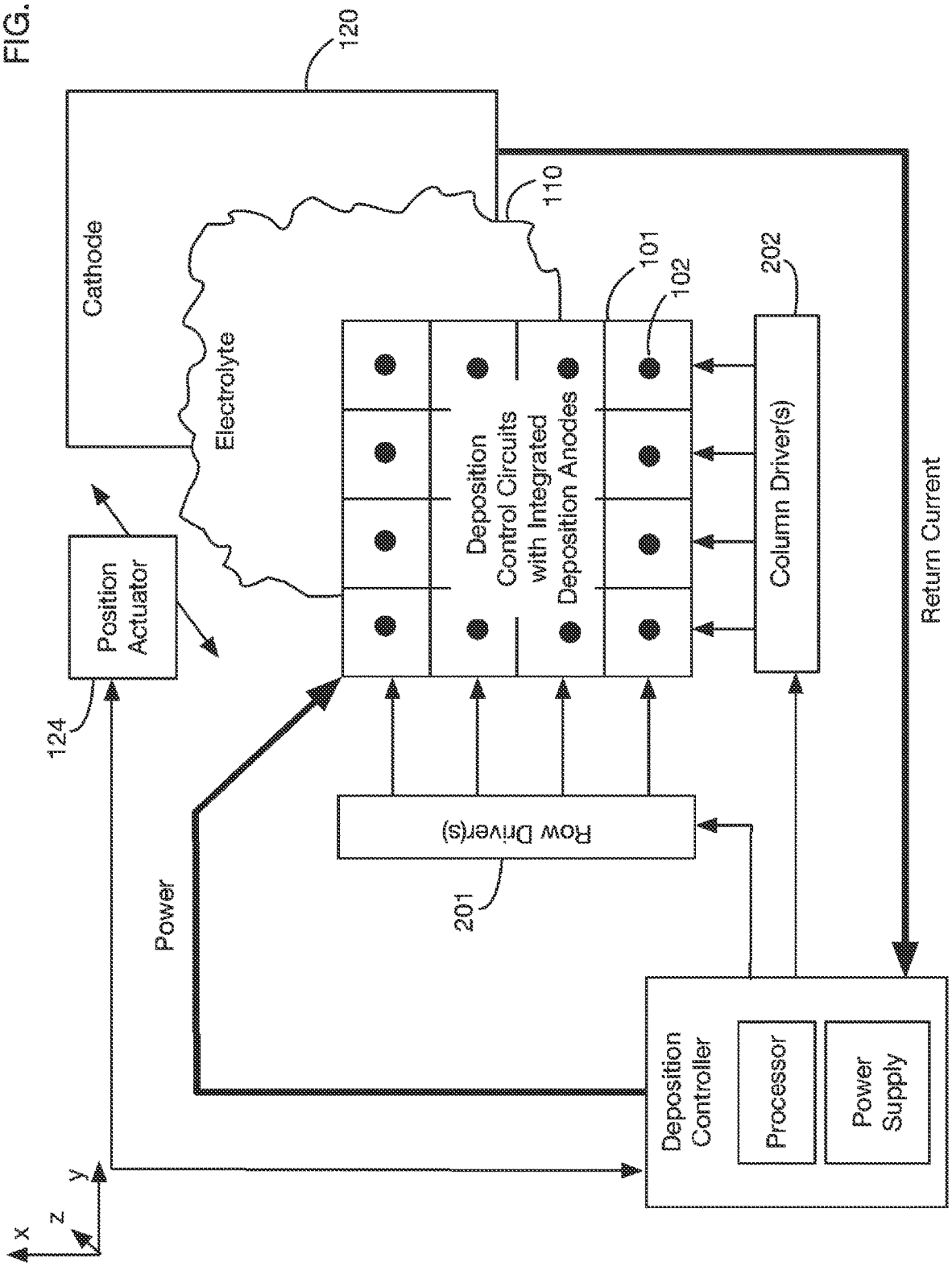

In the embodiment shown in FIG. 4B, the deposition anodes 102 are integrated directly into the deposition control circuits 101, and the entire assembly is in contact with electrolyte 110. In this embodiment, deposition control circuits are built such that the power switching transistor elements are constructed of materials that are capable of direct contact with the electrolyte bath. One or more embodiments may use either of these two approaches (or combinations thereof).

FIG. 5 shows an illustrative embodiment of the approach of FIG. 4A with a separate layer of deposition anodes. This figure is shown as a vertical cross section to illustrate the layers. A small section of the total printhead is shown. Legend 501 indicates the materials that may be used in the various layers: a conductive metal material 502 may be used for deposition anodes, an insulating material 503 may be used for one or more insulating layers, and a conductive material 504 may be used for contact pads on deposition control circuits to which the deposition anodes are attached.

The lowest layer or layers contain deposition control circuits 102. Two illustrative control circuits are shown. The first has switching circuit 511*a* attached to power supply 121; this circuit may be attached also to a row trace and column trace (not shown). Switching circuit 511*a* is connected to a terminal contact pad 512*a*. When switching circuit 511*a* is in a conducting state (as set for example by the associated row and column traces), the conductivity from power supply 121 to contact pad 512*a* is such that deposition current can flow under the right conditions. Similarly switching circuit 511*b* is connected to contact pad 512*b*. Typical embodiments of switching elements may include semiconducting transistor structures fabricated using materials such as doped or undoped Silicon, Amorphous Silicon, Low Temperature Polycrystalline Silicon (LTPS), and metal oxides such as Indium Gallium Zinc Oxide (IGZO).

On top of the deposition control circuit layers one or more layers of anode metal material 502 may be added. The deposition anode layers are electrically coupled to the corresponding contact pads of their associated deposition control circuits. For example, deposition anode 513*a* is coupled to pad 512*a*, and deposition anode 513*b* is coupled to pad 512*b*. The geometry and materials of the deposition anodes may impact the quality of the resulting deposit as well as the lifetime of the anode array. Deposition anodes may be made of material of various levels of solubility.

During deposition (when current is flowing through a deposition anode), soluble materials erode at a rate significantly higher than an electrode constructed out of insoluble materials. This erosion rate often correlates directly to the usable lifetime of the deposition anode array. Soluble anodes may be constructed of materials such as, without limitation, Brass, Chrome, Copper, Nickel, Gold, Silver, Stainless Steel, Tin, Zinc and the like. Insoluble anodes may be constructed for example, without limitation, of platinum group metals (such as Platinum, Iridium, Tantalum, Ruthenium, Titanium) or their associated oxides, doped diamond, highly doped silicon or other semiconductors, carbon-based materials such as glassy carbon, diamond like carbon, carbon based conductors (such as carbon nanotubes for example) and the like. These materials may be added to the printhead by techniques such as vapor deposition, electrodeposition, thermal decomposition, spin coating, spray coating, blade coating, or other methods typical of similar devices.

One or more insulating layers may be added on top of portions of the deposition control circuits and on top of portions of the deposition anodes. In the embodiment shown in FIG. 5, region 514*a* of insulation covers a portion of deposition anode 513*a*, region 514*b* covers a portion of deposition anodes 513*a* and 513*b* and of deposition control circuits, and region 514*c* covers a portion of deposition anode 513*b*. Insulating layers may also separate the switching elements from portions of the deposition anode. Since the deposition control circuits may not be configured to be exposed directly to the electrolyte solution, insulating layers may lie between the deposition control circuits and the electrolyte. Insulating layers may incorporate a dielectric material which provides protection from the electrodeposition chemistry and deposition environment. Typical materials used for insulating layers may include for example, without limitation, ceramics such as Silicon Nitride, Silicon Dioxide, Silicon Oxynitride, Aluminum Oxide or organic materials such as polyimide, epoxy, photoresist, parylene, other polymers, or the like. Insulating structures may consist of one or more of these materials or combinations of materials; these layers may be deposited by vapor deposition, spin coating, spray coating, thermal decomposition, blade coating, or other methods typical of similar devices.

Insulating layers may cover a portion of the deposition anodes, leaving an exposed surface for each anode that is in contact with the electrolyte. For example, in FIG. 5, deposition anode 513*a* has exposed surface 515*a*, and deposition anode 513*b* has exposed surface 515*b*. The non-exposed surfaces of the deposition anodes may be covered by insulator or may be in contact with the contact pads or with other parts of the deposition control circuits.

Even with the use of relatively insoluble conductive materials for deposition anodes, anodes may erode over time as current flows through the anodes to drive the electroplating process. To increase the longevity of a printhead, one or more embodiments may increase the amount of material between the switching elements and the active deposition anode surface. Device lifetime may be approximately correlated to the thickness and/or volume of deposition anode material. More specifically, the lifetime of a deposition anode may be related to the length of the conductive path through the deposition anode, beginning at the interface to the contact pad of the control circuit and ending at the exposed surface of the deposition anode that faces the electrolyte (the distance between the deposition control circuit and the exposed anode surface). Increasing the length of this conductive path may increase the lifetime of the deposition anode, and hence of the entire printhead. One or more embodiments may therefore deliberately lengthen this conductive path to improve longevity. This objective is in marked contrast to typical designs utilized for other purposes (for example for display drivers), where minimizing the length of conductive paths is usually the goal.

In the embodiment shown in FIG. 5, the conductive path for deposition anode 513*a* is path 516*a*. This path is the vertical distance between the top of the contact pad 512*a* and the exposed surface 515*a* of the anode. The length of this path 516*a* represents an amount of anode material that may erode before the electrolyte reaches the contact pad, which may render the anode unusable.

In one or more embodiments, the length of the conductive path may be increased, thereby increasing anode lifetime, for example by increasing the thickness of deposited anode material on top of the switching element or by alternating layers of insulating and conductive material wherein the connection between the conductive layers is offset horizontally to increase the distance that erosion would need to travel prior to reaching the switching elements underneath. FIGS. 6 through 13 illustrate various approaches that may be used in one or more embodiments to obtain this increase in deposition anode lifetime.

FIG. 6 shows a variation on the anode layer and insulating layer design of FIG. 5, where the anode and insulation layers are much thicker than in FIG. 5. The conductive paths 602*a* and 602*b* of deposition anodes 601*a* and 601*b*, respectively, are much longer than the conductive paths 516*a* and 516*b* in the anodes of FIG. 5. While a much thicker anode layer (and thicker insulating layer(s)) may be effective at extending anode lifetime, a potential drawback of this approach is manufacturability, since layer deposition technologies are typically optimized for relatively thin layers. In one or more embodiments, a glass substrate may serve as an insulating layer as suggested in FIG. 6. In one or more embodiments the anodes may be extended horizontally instead of vertically, which allows for an increase in the conductive path without requiring very thick layers to be constructed as in FIG. 6.

Figure 7:
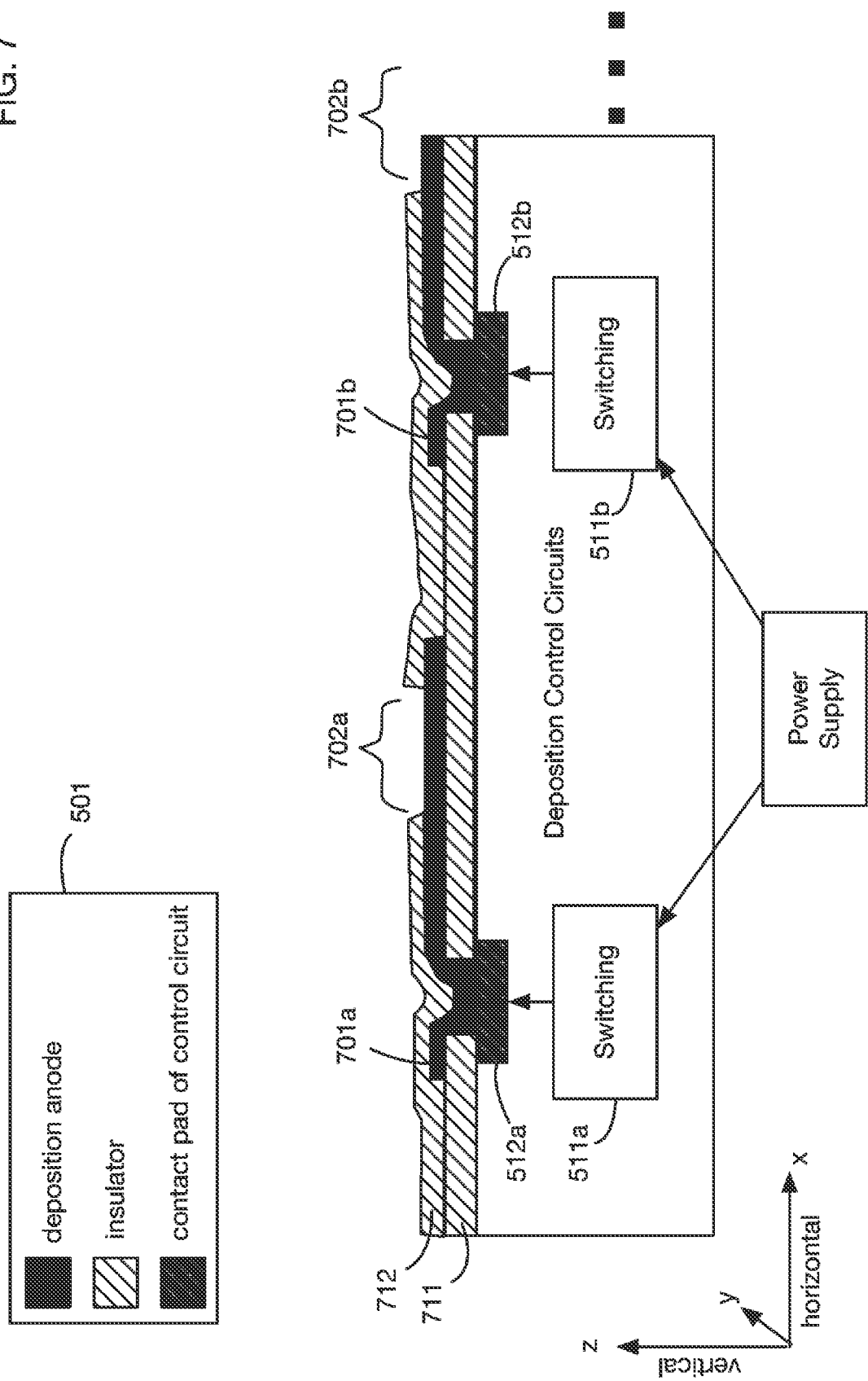
FIG. 7 shows a variation on the design of FIG. 6, where the deposition anodes are offset horizontally from their point of connection with the deposition control circuits.

FIG. 7 shows an illustrative embodiment with horizontally extended anodes. In this embodiment, a first protective insulating layer 711 is placed on top of the deposition control circuits, with vias exposing contact pads 512a and 512b. Insulating layer 711 may include for example one or more layers of chemically vapor deposited Silicon Dioxide and Silicon Nitride that are deposited and patterned to form a protective passivation layer between the switching elements and the anode material. Anodes 701a and 701b may be deposited next, and they may extend horizontally away from the via connections to the contact pads. The anode layer (or layers) may for example include a layer (or layers) of physically vapor deposited Platinum deposited and patterned to form the insoluble deposition anode at each array location. A second layer of insulation 712 (which may be for example more layers of chemically vapor deposited Silicon Nitride and Silicon Dioxide) may then be added on top of portions of anodes and insulating layer(s). The second insulating layer 712 may not completely cover the anodes, since the exposed surfaces must make contact with the electrolyte. In the embodiment of FIG. 7, exposed surfaces 702a and 702b of anodes 701a and 701b, respectively, are offset horizontally (along an axis in the x-y plane) from the point where they connect to the contact pads. This effectively increases the distance erosion needs to travel prior to reaching the switching elements rather than relying on the comparatively thin vertical dimension of the vapor deposited electrode metal.

Figure 8:
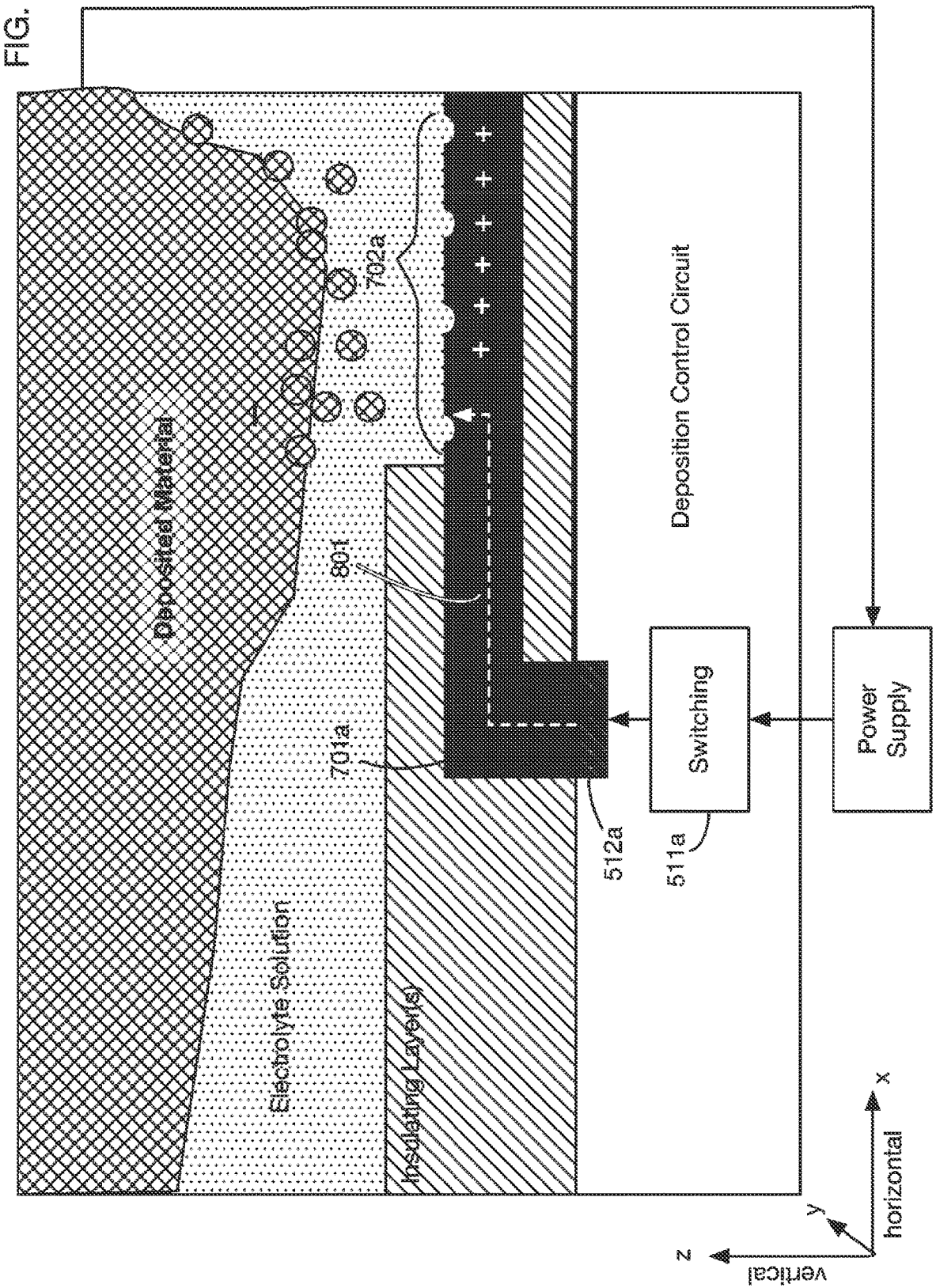
FIG. 8 shows a conceptual view of an individual anode element of the embodiment of FIG. 7 in operation during electroplating, showing that the insulating layer or layers protect the deposition control circuit from the electrolyte solution, and that the horizontal offset of the deposition anode creates a longer conductive path between the electrolyte and the deposition control circuit.

FIG. 8 shows a simplified view of an anode, for example that of one of the anodes 701a of FIG. 7 in operation during an electrochemical reaction. The conductive path through anode 701a starts in the vertical direction, and then continues horizontally until it reaches the exposed surface 702a of the anode that is contact with the electrolyte. Much of the horizontal portion of conductive path 801 is covered by the insulating layer on top of the non-exposed portion of anode 701a. As charge leaves the surface 702a, some material of the anode may erode from this surface over time.

FIG. 9 shows successive erosion of anode material from the anode 701a at successive points in time 900 through 905. At time 901, anode material has eroded from the top of the exposed surface 702a, but the length of the conductive path 801 has not yet changed. At time 902, anode material has begun to erode underneath the insulating layer, and this continues at time 903. At time 904, anode material begins to erode from the vertical via connecting the anode to the contact pad underneath. At time 905, enough anode material has eroded to expose the contact pad, and the anode quickly becomes unusable. The time required for the progression from stage 901 to stage 905 is roughly proportional to the length of the original conductive path 801. An important factor contributing to longevity is that the horizontal portion of conductive path 801 between the via to the contact pad 512a and the exposed anode surface 702a is covered by insulating material; this ensures that the erosion of this portion of the anode cannot occur until the area under the exposed surface has eroded, and it ensures that erosion proceeds effectively along the conductive path 801 rather than perpendicular to this path.

FIGS. 10A through 11B show a specific anode geometry that may be used in one or more embodiments to implement the horizontal offset approach shown conceptually in FIGS. 7, 8, and 9. A deposition anode 1001 is shown from a top view (FIG. 10A) and from a side view (in vertical cross section) (FIG. 10B), both before a top insulating layer is added (upper) and after a top insulating layer is added (lower). Section 1002 of the anode 1001 extends horizontally away from vertical via 1003 that connects the anode to the contact pad 512a. This section is covered by the top insulating layer, leaving exposed surface 1004. The length 1005 of this horizontal section forms a portion of the conductive path length for the anode.

FIGS. 10A and 10B show a single deposition anode of the example shape. FIGS. 11A and 11B show a small portion of a grid of these anodes, illustrating an example of the relative size of the grid pitch and the deposition anode components. FIG. 11A shows masks that may be used for example in the construction of a deposition anode layer and insulation layers on top of a layer (or layers) containing deposition control circuits (and layers that may include for example grid control circuits such as row and column traces, and power distribution circuit traces). The shape of the deposition anodes in the mask corresponds to that of the anode 1001 of FIG. 10A. A grid 1101 is overlaid onto the mask for exposition. The lighter shaded areas 1102 of the anode are covered by the insulating layer(s). The large darker shaded area 1103 is a hole in the upper insulating layer that corresponds to the exposed surface of the deposition anodes. The small darker shaded area 1104 is a hole in the lower insulating layer that exposes the contact pad of the deposition control circuit to the deposition anode. The grid has pitch 1110. The distance 1005 corresponds to the horizontal offset section as described with respect to FIGS. 10A and 10B. In this illustrative example, the horizontal offset distance 1005 is a significant fraction (10% or more) of the grid pitch 1110. One or more embodiments may use a large horizontal offset distance (relative for example to the grid pitch) to increase the length of the anode conductive path, thereby increasing anode longevity.

The size of the exposed surface of the deposition anodes, corresponding to circle 1103 in FIG. 11A, is also large compared to the grid region area. In the embodiment shown, the exposed surface area is more than 15% of the grid region area (which may be for example the square of the grid pitch 1110). This large exposed surface relative to the grid region area provides a potential benefit of increasing anode longevity, since the current that flows from the exposed surface is spread over a larger surface area; the current density at any point on the exposed surface is therefore reduced, thereby reducing the rate of erosion, for example vertical erosion, during deposition reactions.

FIG. 11B illustrates how the masks of FIG. 11A may be used to construct the layers of a complete printhead. A small 2×2 portion of the printhead is shown for ease of exposition. Deposition control circuits 102 are first covered by a lower insulating layer 1121, which has holes corresponding to hole 1104 in FIG. 11A, yielding insulated circuit 1122, which exposes only the contact pads of the deposition control circuits. Deposition anode layer 1123 is then added on top of circuit 1122, yielding circuit 1124, which has fully exposed deposition anodes that are connected to the contact pads underneath. Finally, top insulating layer 1125 is added to cover the horizontal offset portions of the deposition anodes, while leaving the exposed anode surfaces in final printhead 1126.

In one or more embodiments, the length of the conductive path within a deposition anode may be further extended using multiple deposition anode layers. Each layer may be horizontally offset from the connection to the previous layer of anode or contact pad. FIG. 12 shows an illustrative embodiment that uses two deposition anode layers that are horizontally offset relative to one another. The first three layers of the embodiment of FIG. 12 are similar to those of the embodiment of FIG. 7: a first insulating layer 711 is added on top of the deposition control circuits, leaving conductive pads 512a and 512b exposed; a deposition anode layer is then added, forming metal sections 701a and 701b, and a second insulating layer 712 is added on top of the metal layers, leaving portions of the metal exposed. In this embodiment, a second layer of deposition anode material is then added, attaching sections 1201a and 1201b to sections 701a and 701b, respectively. These top metal layer sections are horizontally offset from the first metal layer sections. A final insulating layer 1202 is then added on top, leaving exposed surfaces 1203a and 1203b for the two deposition anodes shown in the figure. In this embodiment, the exposed areas of each anode are horizontally offset from the vertical vias that connect the top anode layer to the bottom anode layer, and these vias are also horizontally offset from the vertical vias that connect the bottom anode layers to the contact pads of the control circuits. This process of stacking anode layers on top of one another may continue in one or more embodiments, and anodes of any number of layers may be created. Each layer may be horizontally offset from the layer below, thereby lengthening the conductive path with each new layer by the amount of the offset.

FIG. 13 shows the conductive path through a two-layer deposition anode 1301 that is similar to the anodes illustrated in FIG. 12. This path includes a first horizontal section 1311 through the first layer of the anode, and a second horizontal section 1312 through the second layer of the anode. Because each of these horizontal sections is covered by one or more insulating layers, the erosion of the anode must proceed roughly along the conductive path of each section before reaching the section below. The lengths of the horizontal offsets of the two anode layers therefore affect the longevity of the anode.

Figure 14:
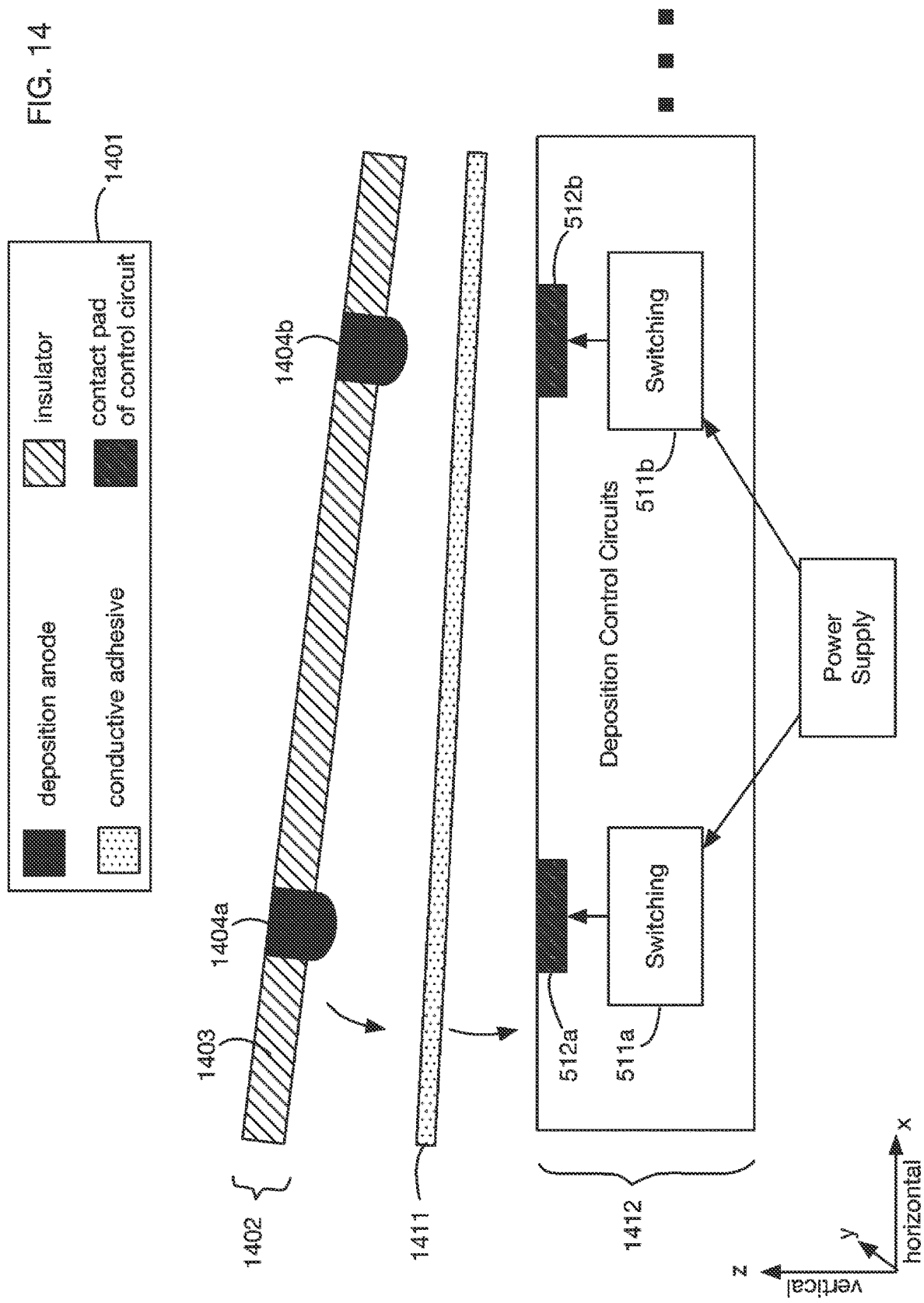
FIG. 14 shows an embodiment in which the deposition control circuit layers and the deposition anode and insulator layers are manufactured as separate units, and are then joined using a conductive adhesive.

In one or more embodiments, the deposition control circuits and the deposition anode array may be fabricated as separate components that are then joined afterwards into a complete printhead. FIG. 14 shows an illustrative embodiment that uses this approach. Deposition anode array component 1402, which contains for example deposition anodes and insulation, may be fabricated as a separate part using thick film techniques typically used for semiconductor packaging or wafer bonding. Deposition control circuits component 1412 may be fabricated for example using thin film transistor technologies. The two parts may be joined by electrically bonding the locations in the switching array to locations in the electrode array component using processes such as anisotropic conductive adhesive, controlled collapse solder bonding, anodic bonding, or other bonding processes typically used in semiconductor packaging or wafer bonding. In the example shown in FIG. 14, a layer of conductive adhesive 1411 is placed between the assemblies 1402 and 1412 to physically join the assemblies and to electrically couple deposition anode 1404a to contact pad 512a, and to electrically couple deposition anode 1404b to contact pad 512b.

Figure 15A:
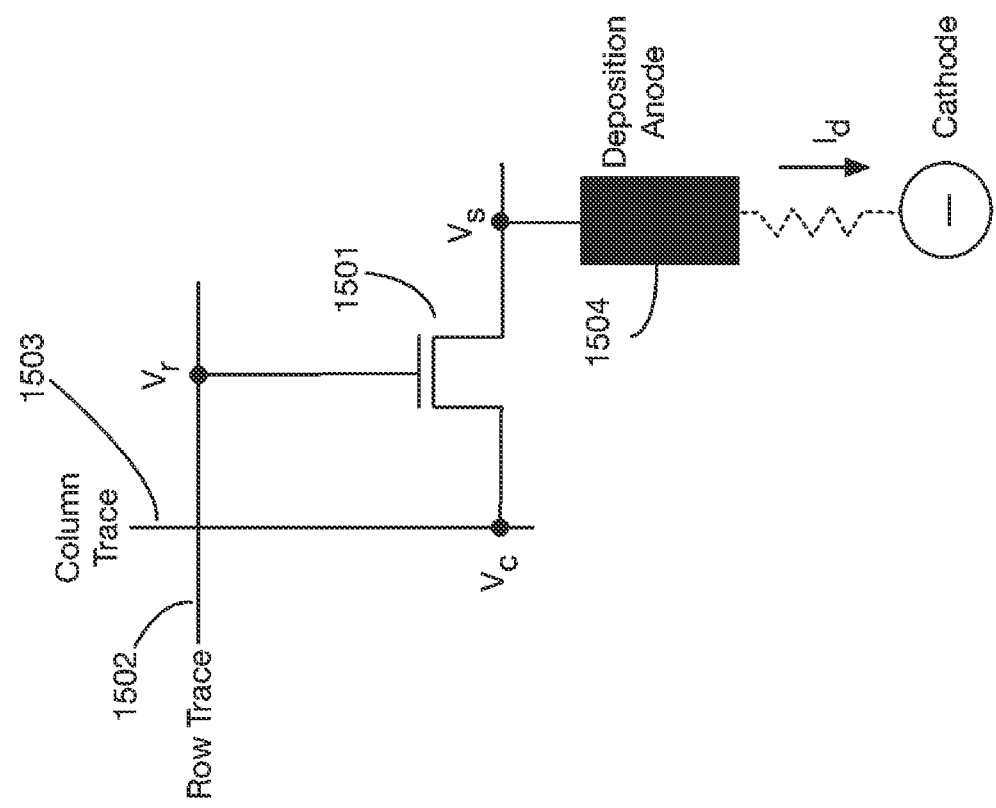
FIG. 15A shows an illustrative passive matrix control circuit for an individual deposition anode.
Figure 16A:
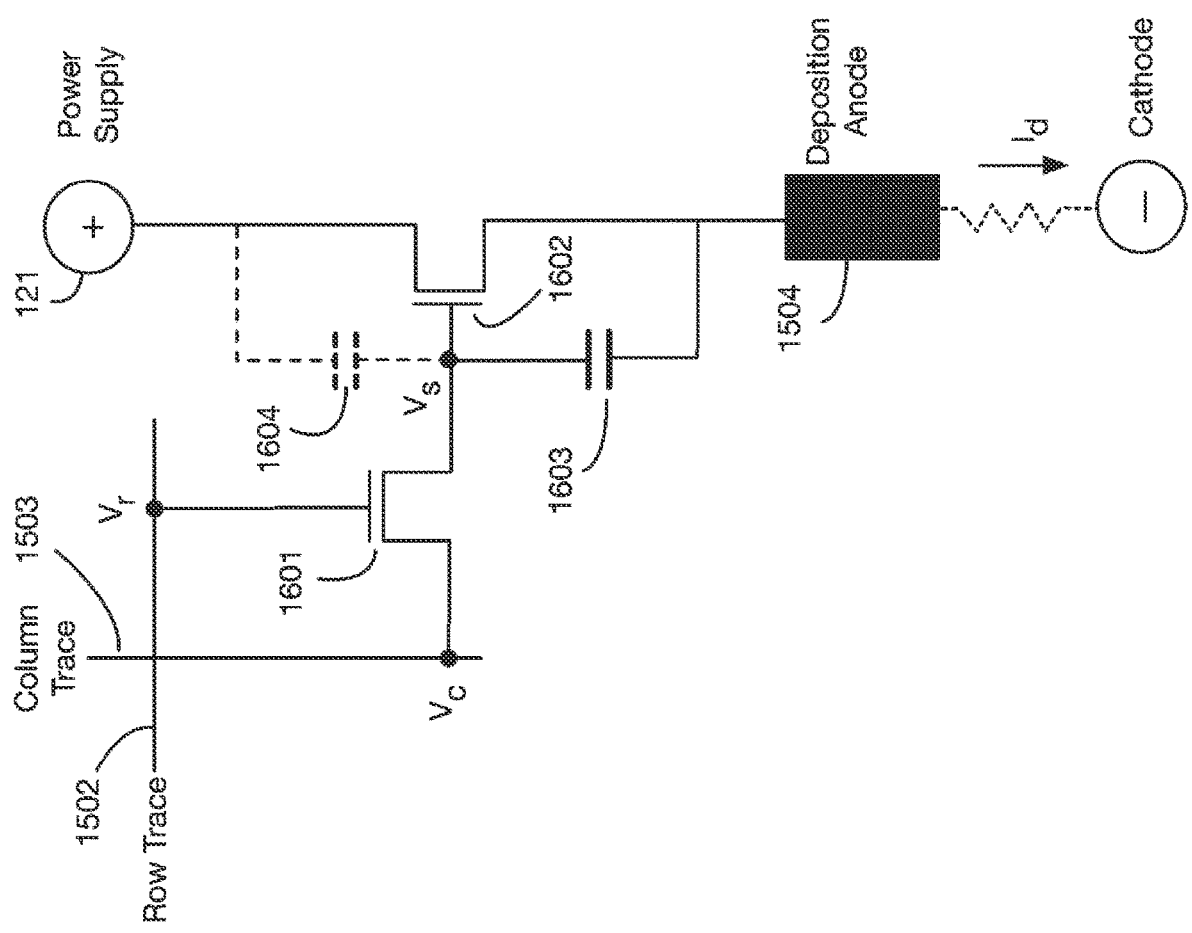
FIG. 16A shows an illustrative active matrix control circuit for an individual deposition anode, which includes a storage capacitor to maintain current flow through the anode.
Figure 16B:
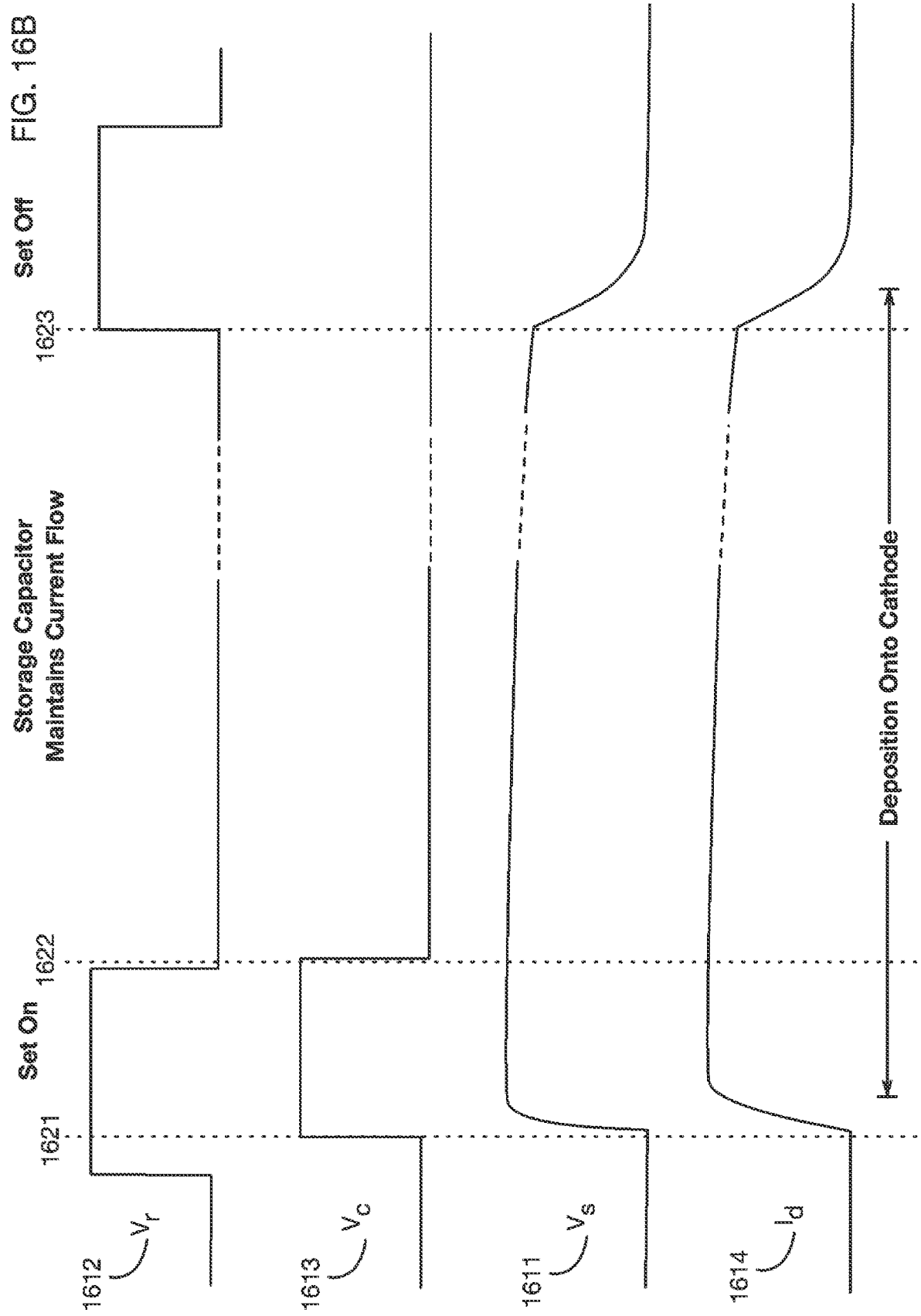
FIG. 16B shows a timing diagram for the control of current flow through the anode of FIG. 16A.

Using the matrix control of deposition control circuits via row and column traces, two different classes of driving embodiments are generally considered: passive matrix (PM) and active matrix (AM). FIGS. 15A and 15B show illustrative circuits and timing diagrams that may be used for one or more embodiments that use a passive matrix architecture, and FIGS. 16A and 16B show illustrative circuits and timing diagrams that may be used for one or more embodiments that use an active matrix architecture. In the illustrative deposition control circuits shown in FIGS. 15A and 16A, the switching elements of the circuits are shown as transistors. One or more embodiments may use any types of switching elements or other circuit components to implement deposition control circuits. Illustrative transistors that may be used in one or more embodiments include for example, without limitation, N-type field effect transistors (FET) whose semiconducting material is low temperature polysilicon (LTPS). In illustrative embodiments, the LTPS (or other semiconductor) material may be deposited onto a substrate of glass or another substrate material, and doped during subsequent processing steps.

In an illustrative passive matrix architecture as illustrated in FIG. 15A, a single switching element or transistor 1501 may be used which allows charge to flow only when provided an excitation (activation) voltage on both the row trace 1502 and column trace 1503 associated with a particular deposition anode 1504. As noted previously, rows and columns may be interchanged.

A deposition controller may control a passive matrix by activating a single row signal trace (from all of the row traces), and then activating the column traces corresponding to anodes in the row whose deposition is required. The control system may sequentially step through the array row by row to address the entire array. While this architecture is relatively simple and requires as few as one switching element per anode, one drawback is that as the control system scans a row/column trace to address the anodes in one trace, all of the remaining anodes are forced off In this way, the duty cycle for any one anode may be much less than 100%. This phenomenon is illustrated in FIG. 15B, which shows the deposition current 1514 flowing through deposition anode 1504 as a function of the signal 1512 on row trace 1502, the signal 1513 on column trace 1503, and the output voltage 1511 from transistor 1501 over time. When the row trace 1512 is switched off (deactivated), current 1514 stops; therefore the duty cycle of the anode 1504 is very short as the deposition controller scans successive rows of the passive matrix.

One alternative to passive matrix array multiplexing is active matrix. In this architecture, a charge storage element may be added to deposition control circuits in the deposition element array. The addition of this charge storage element allows the deposition anode location in the array to remain energized while the controller is addressing subsequent anodes during an array addressing scan. An illustrative active matrix element is shown in FIG. 16A. This element includes two switching elements 1601 and 1602, and one charge storage element 1603.

This architecture may be implemented as a "2T-1C" design, which may include for example two transistors (1601 and 1602) as the switch elements and one capacitor (1603) (two example capacitor locations shown in the figure) as the charge storage element. The charge storage element 1603 in each deposition control circuit may be supplied, for example, by the inherent capacitance of the Field Effect Transistor gate oxide.

The circuit shown in FIG. 16A is illustrative; one or more embodiments may employ variations of this design with different numbers and locations of transistors (or other switching elements) and capacitors (or other storage elements). In particular, any of the active matrix circuits used in display driver technology may be used (with appropriate adaptations) as deposition control circuits. A specific variation is shown with an alternate location 1604 for storage capacitor 1603.

In the design shown in FIG. 16A, one of the switching elements, the addressing transistor 1601 (horizontal), still performs the same function as the switching element 1501 used in the passive matrix design of FIG. 15A, allowing charge to flow only when both the row 1502 and column 1503 associated with that location in the array are both addressed (activated, for example held at a high voltage) at the same time. Charge is then allowed to flow into the charge storage capacitor 1603 (or 1604), and into the gate of the primary drive transistor 1602 (vertical). When substantial charge exists on the gate of the primary drive transistor 1602, process current is allowed to flow from power supply 121 through the primary drive transistor and to deposition anode 1504, which cause deposition to occur at the manufactured part attached to the cathode. In one or more embodiments, the primary drive transistor may be used for variable control of the amount of current allowed to flow through the anode. For example, changing the voltage supplied to column trace 1503 may modify the amount of current that flows through transistor 1602 and thus through deposition anode 1504.

Storage capacitor 1603 maintains the signal to the primary transistor 1602, which allows it to continue passing charge from the power supply 121 even when the controller is not actively addressing the array location. This persistence of the anode current is illustrated in FIG. 16B. Row signal 1612 and column signal 1613 are both on at time 1621, which drives up the control voltage 1611 of the primary drive transistor 1602, and charges storage capacitor 1603. Current 1614 then flows through deposition anode 1504. Row and column traces are then set low at time 1622 (for example, for addressing scans of other anode rows in the array), but current 1614 continues to flow (although it declines gradually over time as the storage capacitor discharges).

To control an entire array of deposition control circuits in an active matrix configuration similar to the that shown in FIG. 16A, the system's processor may cycle through rows and columns as follows. The processor may command a row driver to set a single row select trace to high (for example to +12 volts) while the remainder of the row select traces are held low (for example at −5 volts). The processor then commands a column drive IC to set the column traces associated with the deposition anodes to be energized in that row to high (for example to +8 volts), setting the remainder of the column traces to low (for example to 0 volts). The microcontroller then commands the row driver IC to advance the single row set to high to the next row, and commands the column driver IC to energize (or de-energize) the columns associated with deposition anodes to be energized (or de-energized) in that row. This process is repeated until all active rows have been addressed to activate all required deposition anodes in the active area and is then repeated at appropriate intervals to maintain a required level of charge in each deposition control circuit's charge storage element.

In one or more embodiments, the deposition control circuits may control the amount of current flowing through the deposition anodes, in addition to providing on/off switching. For example, in the active matrix circuit of FIG. 16A, the amount of voltage on column trace 1503 may control the conductivity of transistor 1602, providing variable current control on the flow of current from power supply 121 through transistor 1602 and then through deposition anode 1504. Storage capacitor 1603 may store this control voltage to maintain the conductivity of the transistor even when the row and column traces are deactivated.

An active matrix element can be disabled (for example to stop deposition so that measurement of the deposition progress can occur) by removing the power supply to that element. (In one or more embodiments, different power supplies may be used for different areas of the deposition element array.) There are many other ways to accomplish this that may be used in one or more embodiments. For example, FIG. 16B shows at time 1623 that activating a row (bringing the row signal 1612 to a positive voltage) and deactivating a column (bringing the column signal 1613 to a low voltage) will cause the output current 1614 to shut off. This happens because the current flows out of the storage element capacitor 1603 to ground through the horizontal addressing transistor 1601. Once the voltage at the gate of the vertical primary drive transistor 1602 drops, the output current through deposition anode 1504 shuts off.

Figure 17:
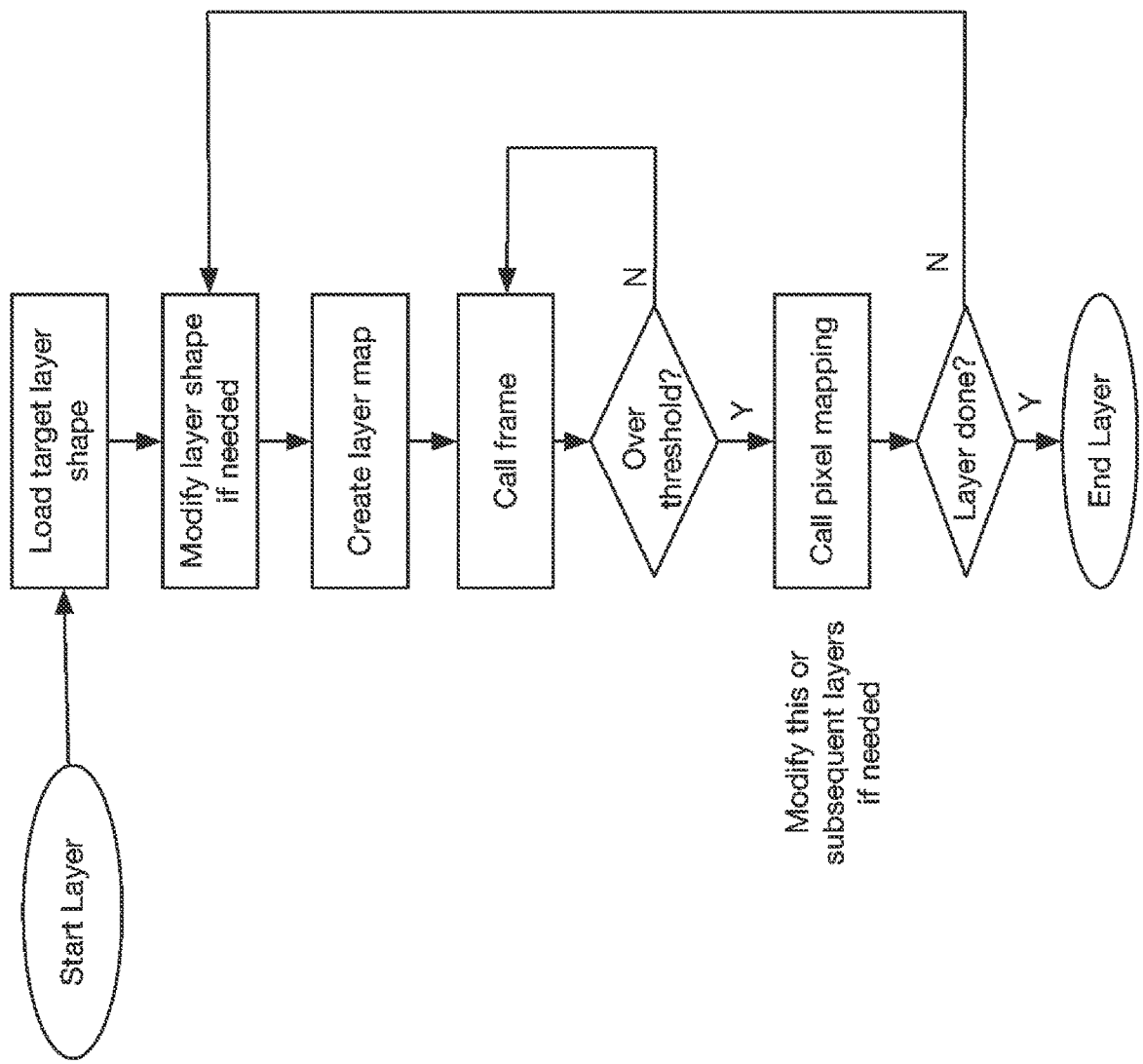
FIGS. 17, 18, and 19 show flowcharts for illustrative processes to construct a 3D part using for example an apparatus with a 3D printhead as shown in FIG. 1.
Figure 18:
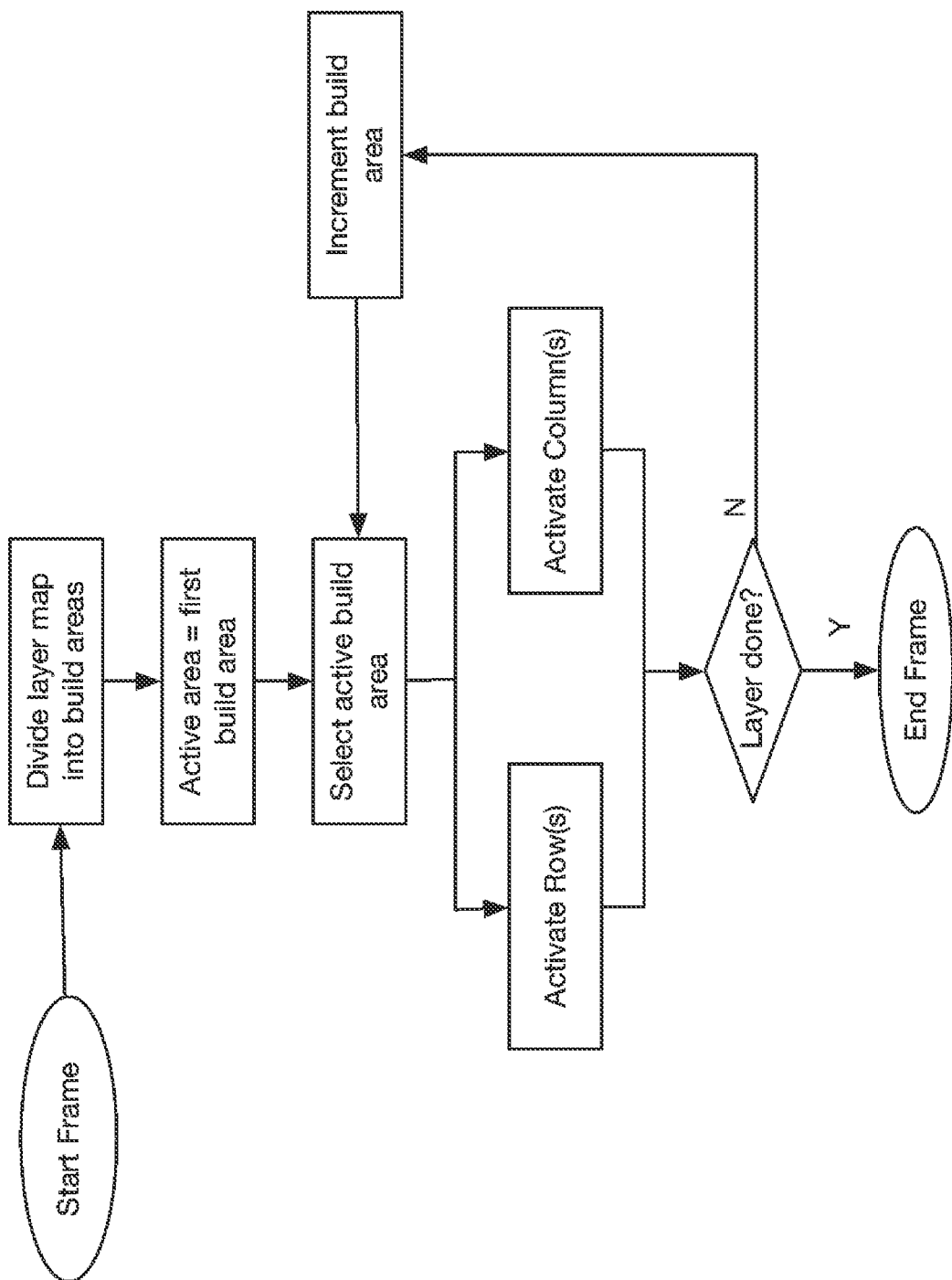
Figure 19:
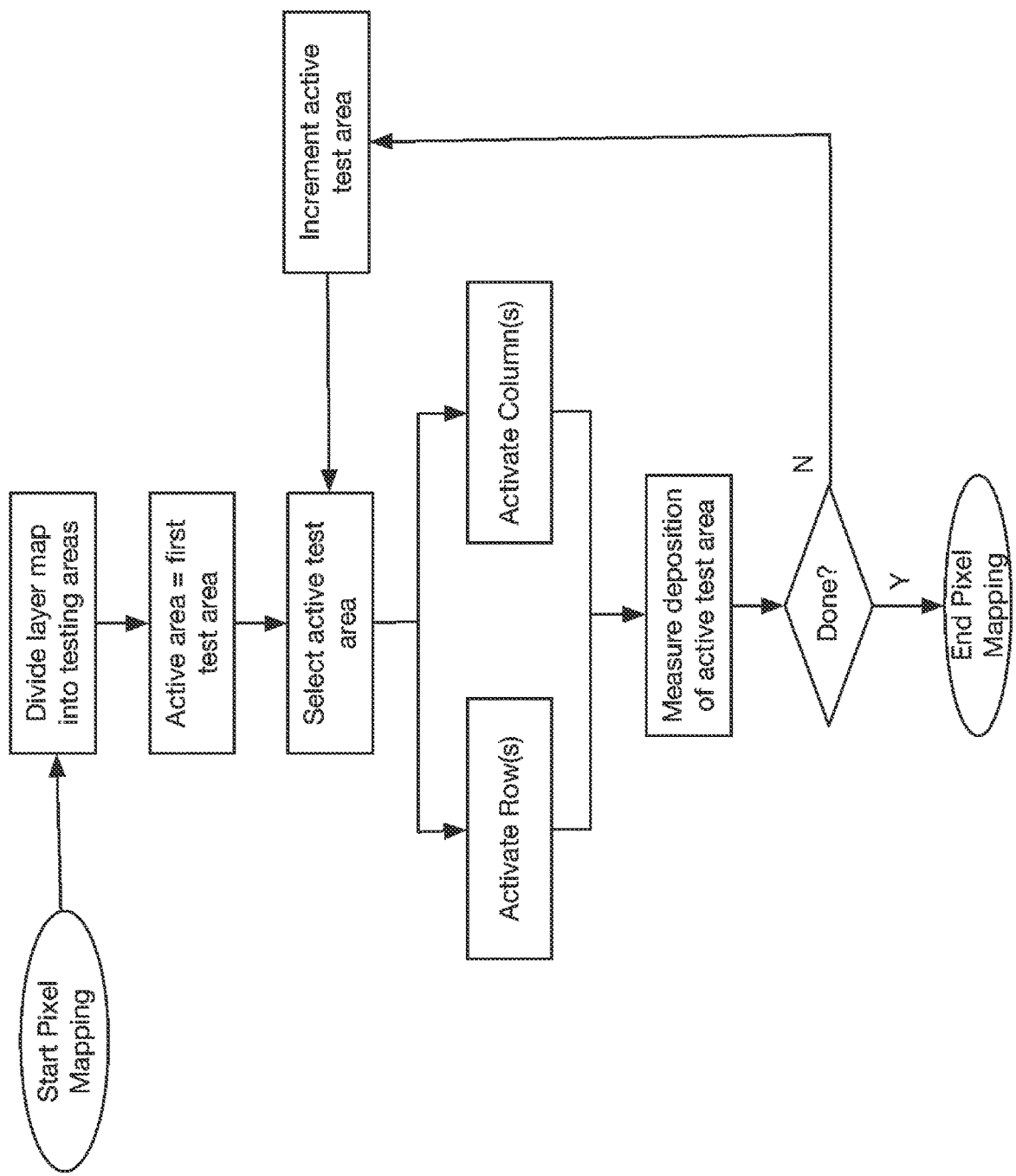

FIGS. 17 through 19 show illustrative flowcharts of a manufacturing process that may use, for example, a printhead as described above within an apparatus such as that illustrated in FIG. 1. There are several methods of operating such an apparatus to control the amount of material deposited onto a manufactured part. One method is activating a pattern of deposition anodes in the array for a set period of time. Another is activating the relevant anodes and allowing them to deposit material until the deposited material fills the gap between the substrate and the anode array, at which time the impedance of the material between the substrate and anode array changes, which causes a change in voltage or current, indicating deposition is complete. A third method is to sequentially activate deposition anodes in the anode array, and measure the electrical current flowing through the array at various periods during the deposition and measuring changes in the impedance between the anode surface and the substrate. These methods, or combinations of these methods may be used by a deposition controller to make determinations as to the state of the deposit on a particular layer or at specific locations across the active area.

In an illustrative layer deposition process illustrated in FIG. 17, a target layer shape is loaded into a controller. The layer shape may be modified to account for manufacturing issues before the layer deposition begins (in some cases due to known characteristics of the deposition process and/or due to results obtained on earlier layers as explained below). The layer shape may be mapped into a frame and then a frame deposition process (explained below) occurs. During the frame deposition process, characteristics of the deposition process may be monitored using techniques such as current measurement, voltage measurement, time measurement, and the like. If it is determined that deposition has reached its target value for one or more deposition anodes in the frame (as indicated by the 'over threshold' decision block) then the pixel mapping process is run (as explained below) that may modify this or subsequent layer maps. If the layer is determined to be complete, then the layer process finishes. If not, then the layer shape is modified if needed based on the pixel mapping and the frame process is called again.

Techniques such as varying the plating input voltage and reading the resulting current flowing through the entire system, performing an averaging calculation and modifying the input voltage to meet a target overall current or target current per electrode may be used to control the process current.

Most typically, the target layer shape, electrode gap between the electrode array and substrate, and process current/voltage may be set as to cause a localized deposition of one layer of material which matches the target layer profile. However, there may be times in which the system is purposefully commanded to periodically increase the electrode gap between the anode array and the substrate so as to more easily allow for generated gas to leave the active build area and for fresh solution to enter. This method can also be combined with the use of the anode array to allow for less localized deposition of material, or non-localized (i.e. uniform plating) deposition of material. This technique may sometimes be used as a means to help connect or combine otherwise discrete or disconnected deposits of material to help them form into one uniform deposit.

FIG. 18 shows a flowchart of an illustrative frame deposition process. When the frame process starts, it may separate the layer map into build areas. These build areas may correspond to the matrixing techniques used to drive the TFT array and may be all distinct, all overlapping, or a combination of distinct and overlapping. They can range in size from one pixel to the entire layer.

A first build area is selected to be active and then the rows and columns corresponding to that active area are activated. For example, build areas may be selected by rows. In this case, all the columns with active pixels on the active row may be activated simultaneously with the active row. In some active matrix embodiments, row and column drivers are used to charge capacitors that will allow TFT power supply (or supplies) to supply deposition current continuing after the active period of the selected build area. If the frame (layer) is done, the frame deposition process ends. If there are more build areas in the active frame (layer), however, the next active build area is selected, and the activation process is repeated.

In an illustrative pixel mapping process shown in FIG. 19, the process starts with a layer map that has been divided into testing areas. These testing areas may correspond to the matrixing techniques used to drive the TFT array and may be all distinct, all overlapping, or a combination of distinct and overlapping. They may range in size from one pixel to the entire layer. As discussed previously, in some active matrix embodiments, row and column drivers may be used to charge hold-up capacitors that will allow TFT power supply or supplies to supply deposition current continuing after the active period of the selected build area. In those cases, a method may be used to stop that deposition current before the mapping process begins (not shown in the figure for clarity). Such techniques may include waiting for the deposition current to decay naturally, removing the power supply, shorting the hold-up capacitors, etc.

Similar to the illustrative frame process of FIG. 18, a first test area is selected to be active and then the rows and columns corresponding to that active area are activated. For example, a test area may be a single pixel selected by a single active row and a single active column. The deposition state of the active test area is then estimated through techniques such as measuring current, measuring voltage, or the like. For example, a large current may indicate that the test area deposition has reached the anode, which generally means that the test area is done with deposition for this layer.

If all the test areas have been measured, the pixel mapping process ends. If there are more test areas in the active layer) however, the next active test area is selected, and the pixel mapping process is repeated.

In one example method of pixel mapping, a single anode location is energized and the power consumption at that location is measured. In other embodiments, multiple anode locations may be energized at one time. In some embodiments, a device may have different regions of power supply traces, each region capable of being independently monitored, or sets of drive ICs capable of independently driving various regions of the active area, or a combination of these things. In such embodiments, the power consumption at multiple points may be measured simultaneously, thus greatly speeding up the characterization of a device relative to one wherein only a single anode location can be measured at a time.

Figure 20:
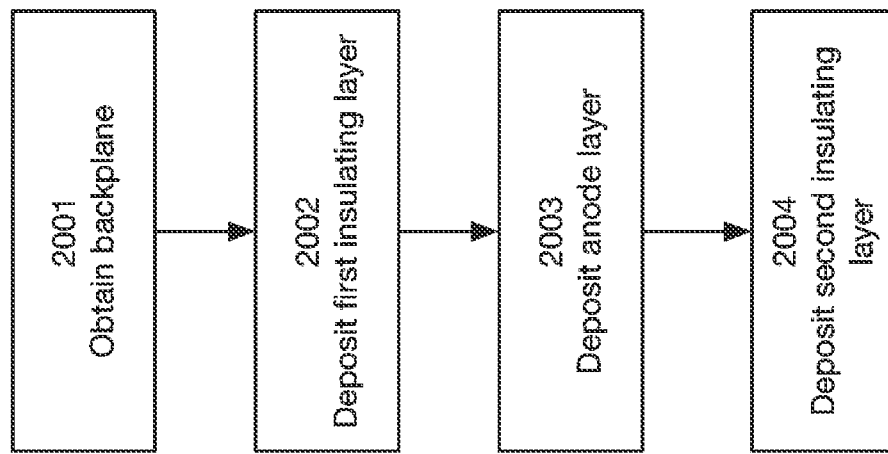
FIG. 20 shows a high-level flowchart for an illustrative manufacturing process that builds a printhead by depositing layers on top of a backplane.

FIGS. 20 through 25 illustrate one or more manufacturing processes that may be used in one or more embodiments to create a printhead such as the ones described above. FIG. 20 shows a high-level flowchart of an embodiment of a printhead manufacturing process that generates a printhead by depositing layers on top of a backplane. A backplane is first obtained in step 2001. This backplane may contain for example deposition control circuits and associated grid control and power circuits. The grid control circuit may include row and column lines and row and column drivers, as illustrated for example in FIG. 2. In one or more embodiments, the backplane may be manufactured for example by adapting display matrix backplane technologies that may be used to generate backplanes for LCD or OLED monitors. Layers may then be deposited on top of the backplane to form the complete printhead. In one or more embodiments, a first insulating layer may be deposited onto the backplane in step 2002, an anode layer may be deposited in step 2003, and a second insulating layer may be deposited in step 2004. The layers may be deposited so that each anode makes an electrical connection with one or more corresponding deposition control circuits of the backplane. The second insulating layer may leave an exposed area of each deposition anode so that it can contact the electrolyte when the printhead is used to manufacture a part. In one or more embodiments, additional steps may add any number of additional anode layers or any number of additional insulating layers. For example, a total of two anode layers and three insulating layers may be added on top of the backplane as shown in FIG. 12.

Figure 21:
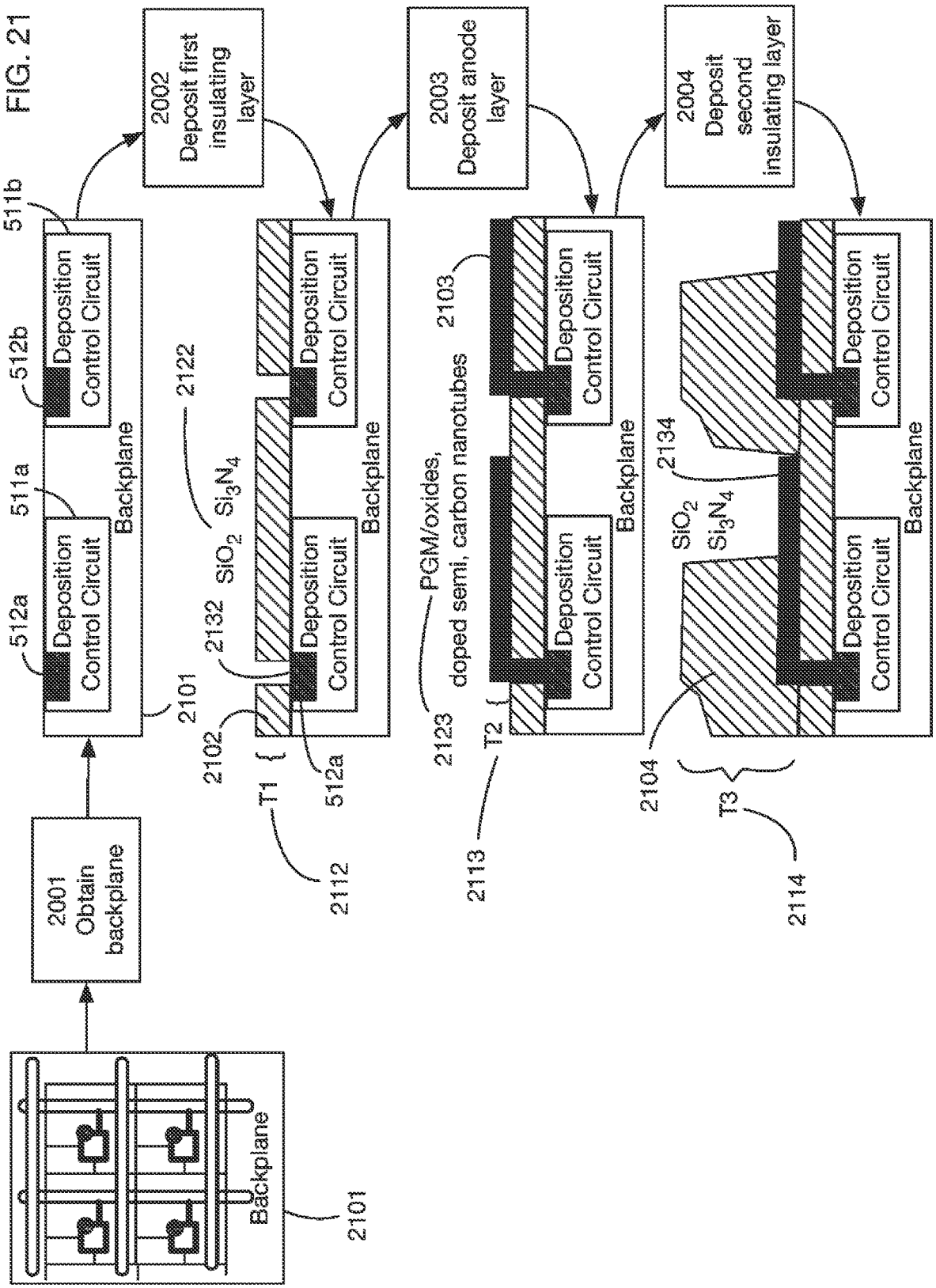
FIG. 21 illustrates the printhead manufacturing steps shown in FIG. 20, with illustrative layer thickness and materials.

FIG. 21 illustrates steps 2001 through 2004 of FIG. 20. Backplane 2101 is obtained in step 2001. Each deposition control circuit in the backplane is connected to an associated row line and column line, and to a power distribution circuit. A contact pad is associated with each deposition control circuit for connection to the deposition anode. A side cross-section view of a small portion of backplane 2101 shows two deposition control circuits 511a and 511b, with associated contact pads 512a and 512b.

Step 2002 deposits a first insulating layer 2102 onto backplane 2101. The first insulating layer's primary purpose is to increase the mechanical and chemical resilience of the backplane to the electrolyte solution. In one or more embodiments, first insulating layer 2102 may include for example materials 2122 (Silicon Nitride, Silicon Dioxide, or alternating layers of Silicon Dioxide and Silicon nitride). The average thickness 2112 (T1) of this insulating layer may be at least 100 nanometers in one or more embodiments; in one or more embodiments the average thickness 2112 may be as much as 20 micrometers (20,000 nanometers). In one or more embodiments the first insulating layer 2102 may be deposited through a Plasma Assisted Chemical Vapor Deposition (PECVD) process.

The resulting dielectric layer 2102 may then be patterned to allow for an electrical connection through the layer between the anode layer and the contact pads of the deposition control circuits. For example, a gap 2132 in the insulating layer may expose contact pad 512a. In one or more embodiments, patterning of the insulating layer may be done by selectively masking the region and exposing a portion of the dielectric region to an etching process. This etching process may be done with either wet or dry etching processes. Illustrative wet etching processes may include submerging the masked substrates in solutions of hydrofluoric acid. Illustrative dry etching processes may involve placing the substrates in a plasma environment where select gases are introduced. These gases may include for example SF6, O2, CF4, Nitrogen, or Argon.

In one or more embodiments the insulating layer may be constructed using techniques other than chemical vapor deposition, including for example, without limitation, spin on glass, atomic layer deposition (ALD) of a dielectric such as Al2O3, deposition of permanent photosensitive epoxy or polymers such as SU8 or BCB, or deposition of other organic dielectric layers such as polyimide.

In step 2003, anode layer 2103 is deposited on top of insulating layer 2102 (and on top of exposed portions of the deposition control circuits). Each deposition anode is coupled electrically to the corresponding contact pad of the deposition control circuit below. In one or more embodiments, a deposition anode may be coupled electrically to the contact pads of multiple deposition control circuits; this may allow multiple deposition control circuits to drive a single anode, either separately or collectively. In one or more embodiments the anode layer may consist of or include insoluble conductive materials 2123, such as Platinum, Iridium, Tantalum, other Platinum group metals, or their associated oxides, highly doped semiconductor materials, or carbon based conductors. The average thickness 2113 (T2) of this anode layer 2103 may be 50 nanometers or more in one or more embodiments; in one or more embodiments this average thickness 2113 may be as much as 2 millimeters (20,000,000 nanometers). The anode layer may be constructed using various techniques such as physical vapor deposition (PVD, or, sputtering) or chemical vapor deposition (CVD), as illustrated below.

In step 2004, a second insulating layer 2104 is deposited on top of portions of the anode layer 2103. An exposed portion 2134 of each deposition anode is left uncovered (or the insulation covering it is removed) so that the deposition anode can contact the electrolyte. In one or more embodiments, the process and materials of the second insulating layer may be similar to those of the first insulating layer 2102. The average thickness 2114 (T3) of this second insulating layer may be the same as or different from the average thickness 2112 of the first insulating layer. In one or more embodiments the average thickness 2114 of the second insulating layer may be at least 100 nanometers, and may be as much as 20 micrometers (20,000 nanometers).

Preferred or desired thickness of the insulating and anode layers may depend on material properties; as material performance is improved, layer thicknesses may be reduced while still maintaining the desired performance and longevity of the printhead. With current materials, layer thicknesses (in nanometers) are shown in the table below for four illustrative embodiments A, B, C, and D:

| Embodiment | T1 (nm) | T2 (nm) | T3 (nm) |
| --- | --- | --- | --- |
| A | 800 | 800 | 1500 |
| B | 800 | 1600 | 1500 |
| C | 800 | 800 | 2000 |
| D | 800 | 1600 | 2000 |

Figure 22:
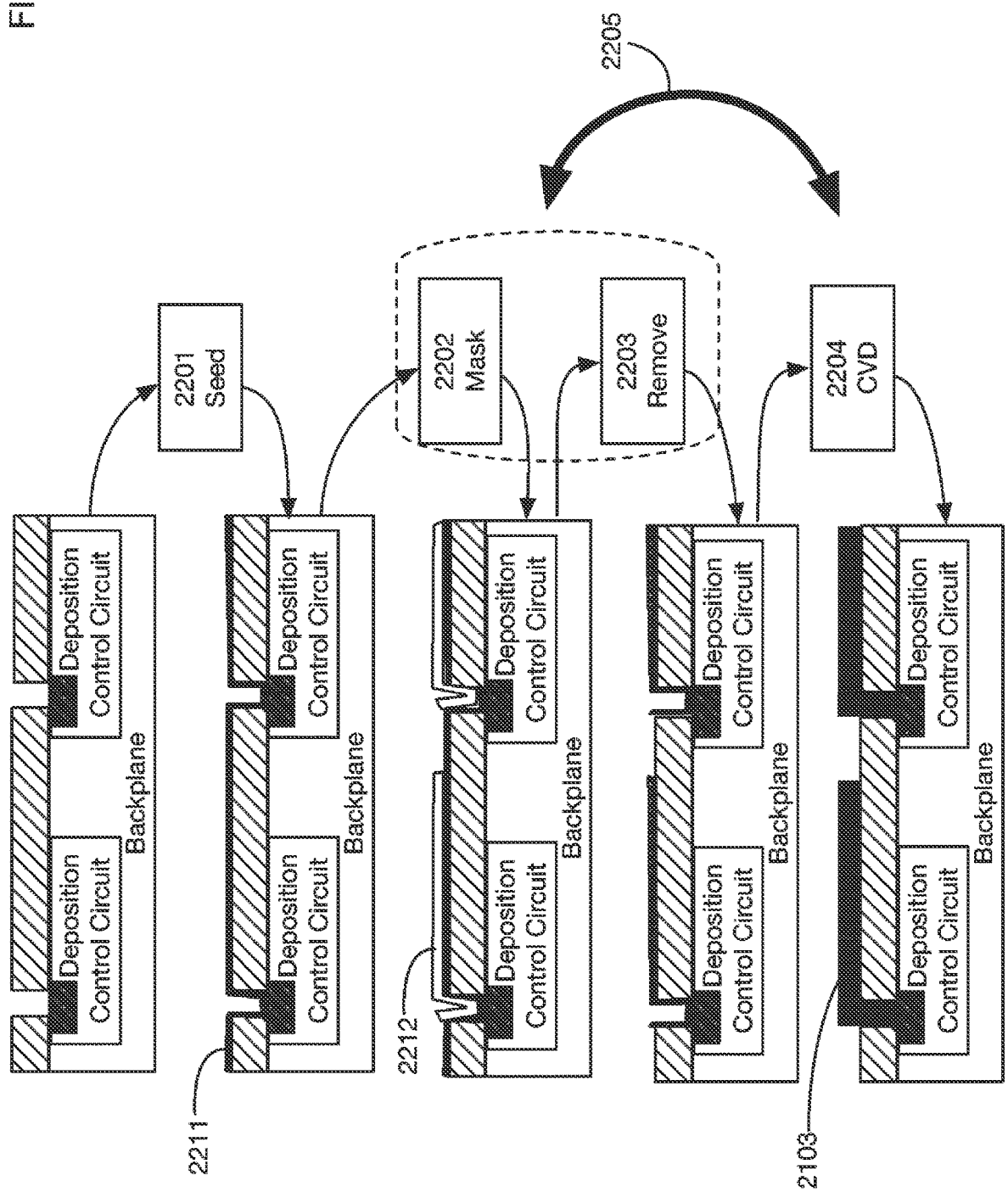
FIG. 22 shows an illustrative process for depositing an anode layer that uses chemical vapor deposition.
Figure 23:
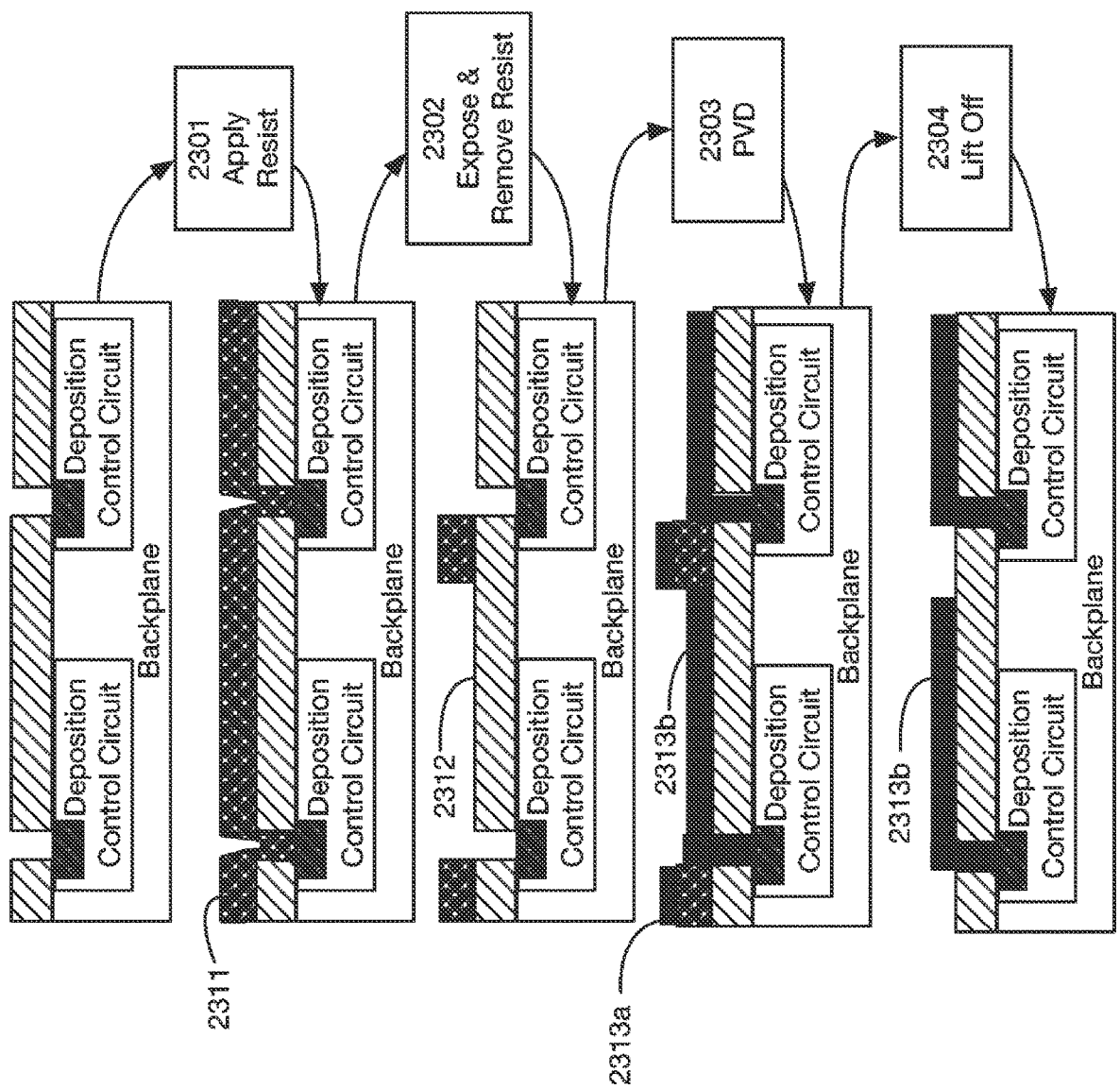
FIG. 23 shows another illustrative process for depositing an anode layer that uses physical vapor deposition.

FIGS. 22 and 23 show illustrative techniques that may be used in one or more embodiments to construct the anode layer: FIG. 22 shows chemical vapor deposition and FIG. 23 shows physical vapor deposition. In the process illustrated in FIG. 22, step 2201 first deposits a seed layer 2211 on top of the first insulating layer. This seed layer may for example include Niobium or Titanium Nitride, onto which a suspension of diamond nanoparticles is applied. In step 2202, a mask 2212 may be applied over the seed layer in the pattern of the desired deposition anodes. The mask may be sputtered for example, and may for example be made of Aluminum. In step 2203, the material not covered by the mask may be removed, and then the mask may be removed, leaving only the seed layer in the desired pattern of the deposition anode array. Mask removal may be performed for example using photoresist and wet etching to remove the Aluminum not under the photoresist, followed by a quick oxygen plasma to remove the newly exposed diamond seed particles, followed by removal of the remaining Aluminum, leaving the diamond seed particles only in desired anode locations. In step 2204, the anodes may be constructed on top of the remaining seed material using chemical vapor deposition. The substrate may be placed into a CVD reactor, and process gases including boron dopant may cause boron doped diamond to grow at each seed crystal location. Deposition may continue until at least a continuous film is formed, but it may continue as long as desired to create an anode layer of the desired thickness.

In one or more embodiments, the masking and removal steps may be interchanged 2205 with the chemical vapor deposition step, so that patterning is performed after deposition. For example, CVD may be performed over the entire seed layer, and then a mask may be applied over the resulting boron doped diamond (BDD) layer to mask the regions that correspond to the desired deposition anodes. The part may then be exposed for example to Oxygen plasma that removes the exposed boron doped diamond. Suitable mask materials may include those that are typically resistant to oxygen plasma, such as metals Al and Mo.

FIG. 23 shows an illustrative process that uses physical vapor deposition (PVD) to construct the anode layer. In step 2301, a resist 2311 is applied over the first insulating layer. This resist layer 2311 may be a bi-layer photoresist, with the top layer being a typical photosensitive resist, and the bottom layer a non-photosensitive polymer. During the development process the two different resist materials may form a strongly undercut profile which allows for a technique known as "lift-off". In step 2302, a portion of the photoresist is exposed and removed, leaving portions 2312 of the first insulating layer uncovered by the resist. In step 2303, physical vapor deposition may be used to apply the anode layer material. Portions 2313a of the anode material may be over the remaining photoresist, and other portions 2313b may be over the insulating material (or in contact with the contact pads of the deposition control circuits). Then in step 2304, the "lift off" step, the part may be submerged in a solvent which releases the photoresist and the anode layer film from regions 2313a, leaving the desired anode structures 2313b. In one or more embodiments, instead of masking regions with photoresist prior to PVD, anode material may be first deposited using PVD and then wet or dry etched for patterning. Illustrative dry etching processes may involve placing the substrates in a plasma environment where select gases are introduced. These gases may include for example SF6, O2, CF4, Nitrogen, or Argon. Illustrative wet etching chemistry is "Aqua regia", a mixture of nitric acid and hydrochloric acid, with Cr used as a hard masking layer as it resists the wet etch chemistry and is readily patterned with typical photoresist and Cr patterning operations.

Figure 24:
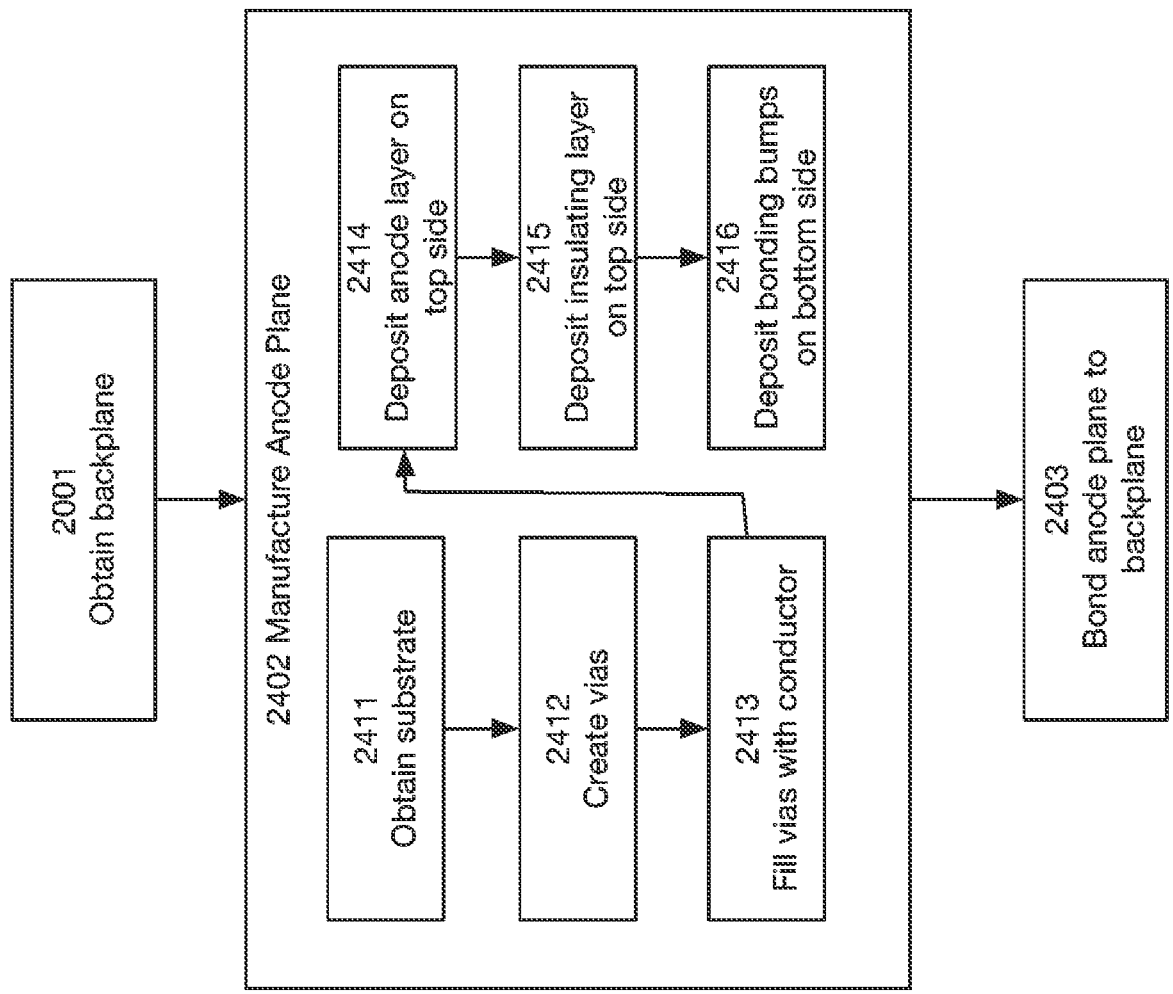
FIG. 24 shows a high-level flowchart for an illustrative manufacturing process that builds a printhead by manufacturing a separate anode plane and then bonding the entire anode plane to the backplane.

FIGS. 24 and 25 illustrate a different technique for manufacturing a printhead that may be used in one or more embodiments, which constructs a separate anode plane component and then bonds the anode plane to a backplane. FIG. 24 shows a flowchart of high-level steps of such a process. A backplane may be obtained in step 2001, as described above. A separate anode plane may then be constructed in steps 2402. Anode plane manufacturing may first include step 2411 of obtaining a substrate. A substrate may be selected that is compatible with the process; for example it may be a thin glass or silicon substrate with low conductivity. The thickness of the substrate impacts the minimum pixel pitch due to some of the process steps, so in one or more embodiments it may be relatively thin: on the order of 200-500 microns, for example. In step 2412, openings, or "vias", may be created through this substrate at each deposition anode location. Vias may be created for example using an etching technique, either a dry (plasma) etch, or wet (liquid) etch process. These openings are then filled in step 2413 with an electrically conductive material to allow an electrical connection between a deposition anode on one of side of the anode plane to communicate electrically with the other side of the anode plane. Vias may be filled with electrodeposited materials such as copper, silver, platinum, nickel, gold; with materials deposited via chemical vapor deposition such as tungsten; or with systems of metal and ceramic powders which are fired to the ceramic's melting point, creating a matrix to hold the metal powders and create a hermetic seal across the substrate opening. The metal/ceramic powder matrix systems may have great flexibility in the materials and ceramics which can be used, with one combination being platinum powder and 'glass frit'.

After the vias are filled, depending on the fill method one or both sides of the substrate may be polished to create a flat surface. On a "top" side of the substrate, anode materials may be deposited and patterned in step 2414 using for example the same materials and techniques as described above, such as PVD with platinum group metals, Electroplated Platinum, or CVD with BDD. Each anode may be coupled electrically to one or more vias. An insulating layer may be deposited on top of the anode layer in step 2415. In one or more embodiments, additional anode layers or insulating layers may be deposited onto the top side of the anode plane. In step 2416, a bump for bonding each deposition anode location is attached to the bottom side of the substrate. Bonding bumps may be deposited for example using a thick photomask, and a deposit of bump material may be left at each anode location. Bump material may be for example gold, copper, silver, lead, tin or some mixture depending on bump methodology.

In step 2403, the anode plane and the backplane are bonded together to form the complete printhead. The anode plane and the backplane must be aligned; then they are bonded to create an electrical connection between each deposition control circuit in the backplane and each deposition anode location in the anode plane through the bump. This bonding may be done for example with eutectic bonding, thermocompression bonding, controlled collapse solder bonding, or with the aid of an anisotropic conductive adhesive.

FIG. 25 illustrates the steps of the process shown in FIG. 24, showing a side cross-section view of the components. Substrate 2501 is obtained in step 2411. Step 2412 creates vias such as via 2502 through the substrate, and step 2413 fills the vias with conductive material 2503. In steps 2414 and 2415 an anode layer 2504, and an insulating layer 2505, are deposited on top of the substrate. Step 2416 deposits bumps such as 2506 onto the bottom of the substrate so that they are in electrical contact with the vias. The anode plane is then complete, and in step 2403 it is bonded to backplane 2101 by making electrical connections 2507 between the bonding bumps and the control pads of the deposition control circuits.

While the invention herein disclosed has been described by means of specific embodiments and applications thereof, numerous modifications and variations could be made thereto by those skilled in the art without departing from the scope of the invention set forth in the claims.

What is claimed is:

1. A method of making an electrochemical-deposition printhead, the method comprising steps of:
   forming deposition anodes by filling openings with a conductive material, the openings extending from a top surface to a bottom surface of a substrate that comprises an insulating material; and
   coupling the deposition anodes to a backplane, wherein the backplane comprises:
      a grid control circuit, comprising an array of row traces, an array of column traces, a row driver circuit, electrically coupled to the row traces, and a column driver circuit, electrically coupled to the column traces;
      a power distribution circuit; and
      deposition-control circuits, aligned with a deposition grid, wherein each of the deposition-control circuits is electrically coupled to the power distribution circuit, an associated one of the row traces, and an associated one of the column traces.

2. The method of claim 1, further comprising depositing bonding bumps onto the bottom surface of the substrate, so that each of the bonding bumps is electrically coupled to the conductive material in one of the openings.

3. The method of claim 2, wherein the step of coupling the deposition anodes to the backplane comprises coupling each of the bonding bumps to one of the deposition-control circuits to establish an electrical connection between each of the deposition-control circuits and a corresponding one of the deposition anodes.

4. The method of claim 3, wherein the step coupling the deposition anodes to the backplane comprises coupling each of the bonding bumps to one of the deposition-control circuits using one or more of eutectic bonding, thermocompression bonding, or controlled-collapse solder bonding.

5. The method of claim 1, further comprising aligning the substrate with the backplane before the step of coupling the deposition anodes to the backplane.

6. The method of claim 1, wherein:
   each of the deposition anodes comprises an insoluble conductive material,
   each of the deposition-control circuits comprises one of a plurality of contact pads, and
   the step of coupling the deposition anodes to the backplane establishes an electrical connection between each of the deposition anodes and one of the plurality of contact pads.

7. The method of claim 1, wherein the step of coupling the deposition anodes to the backplane comprises bonding the substrate to the backplane using an anisotropic conductive adhesive so that an electrical connection is established between each of the deposition-control circuits and a corresponding one of the deposition anodes through the anisotropic conductive adhesive.

8. The method of claim 1, further comprising polishing the top surface and the bottom surface of the substrate.

9. The method of claim 2, wherein the bonding bumps are made of at least one of gold, copper, silver, lead, or tin.

10. The method of claim 6, wherein the insoluble conductive material comprises one or more of platinum group metals and their associated oxides, highly doped semiconducting materials, or carbon nanotubes.

11. The method of claim 1, wherein the conductive material that fills the openings is a metal-ceramic composite material.

12. The method of claim 1, wherein the conductive material that fills the openings is one of copper, silver, nickel, tungsten.

13. The method of claim 1, wherein the substrate is made of glass.

14. The method of claim 1, wherein the substrate is made of silicon.

15. The method of claim 1, wherein the substrate has a thickness from 50 nanometers to 2000 micrometers.

16. The method of claim 1, wherein the step of forming the deposition anodes further comprises depositing anode layers onto the top surface of the substrate so that each one of the anode layers is in electrical contact with the conductive material in a corresponding one of the openings.

17. The method of claim 16, further comprising depositing an insulation layer onto the substrate and onto only a portion of each one of the anode layers.

18. The method of claim 1, wherein the openings are filled via an electrochemical deposition process.

19. The method of claim 1, wherein the openings are filled via a chemical vapor deposition process.

20. The method of claim 1, wherein the openings are filled by:
heating a powder, made of a metal material and a ceramic material, to a melting point of the ceramic material to create a matrix that holds the metal material; and
applying the matrix and the metal material onto the openings to create a hermetic seal across the openings.

* * * * *